US011508909B2

(12) United States Patent
Moriyama et al.

(10) Patent No.: US 11,508,909 B2
(45) Date of Patent: Nov. 22, 2022

(54) ORGANIC ELECTRONIC MATERIAL AND USE OF SAME

(71) Applicant: HITACHI CHEMICAL COMPANY, LTD., Tokyo (JP)

(72) Inventors: Ryota Moriyama, Hitachi (JP); Naoki Asano, Tsukuba (JP); Iori Fukushima, Tsukuba (JP); Hiroshi Takaira, Hitachinaka (JP); Kazuyuki Kamo, Tsukuba (JP); Shunsuke Kodama, Tsukuba (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 68 days.

(21) Appl. No.: 16/489,777

(22) PCT Filed: Feb. 28, 2018

(86) PCT No.: PCT/JP2018/007555
§ 371 (c)(1),
(2) Date: Aug. 29, 2019

(87) PCT Pub. No.: WO2018/159694
PCT Pub. Date: Sep. 7, 2018

(65) Prior Publication Data
US 2020/0013956 A1    Jan. 9, 2020

(30) Foreign Application Priority Data
Mar. 2, 2017    (JP) ............................. JP2017-039341

(51) Int. Cl.
*H01L 51/00*    (2006.01)
*C08G 61/12*    (2006.01)
(Continued)

(52) U.S. Cl.
CPC .......... *H01L 51/0035* (2013.01); *C08G 61/12* (2013.01); *C09D 11/102* (2013.01);
(Continued)

(58) Field of Classification Search
CPC ........................... C08G 61/12; C08G 73/026; C08G 2261/124; C08G 2261/1412;
(Continued)

(56) References Cited

U.S. PATENT DOCUMENTS

2004/0170863 A1    9/2004   Kim
2008/0149923 A1    6/2008   Ohsawa
(Continued)

FOREIGN PATENT DOCUMENTS

CN    101616957 A    12/2009
CN    102791768 A    11/2012
(Continued)

OTHER PUBLICATIONS

Envin Bacher et al., "Photopatterning of Crosslinkable Hole-Conducting Materials for Application in Organic Light-Emitting Devices", Macromolecular Rapid Communications, 2004, pp. 1191-1196 XP-002636876 (cited in an search report in counterpart European Patent Application No. 17789309.6 dated Jan. 2, 2020).
(Continued)

*Primary Examiner* — Shane Fang
(74) *Attorney, Agent, or Firm* — Fitch, Even, Tabin & Flannery, LLP

(57) ABSTRACT

An organic electronic material containing a charge transport compound having at least one of the structural regions represented by formulas (1), (2) and (3) shown below. In the formulas, Ar represents an arylene group or heteroarylene group of 2 to 30 carbon atoms, a represents an integer of 1 to 6, b represents an integer of 2 to 6, c represents an integer of 2 to 6, and X represents a substituted or unsubstituted polymerizable functional group.

(Continued)

$$-Ar-O-(CH_2)_a-O-CH_2-X \quad (1)$$

$$-Ar-(CH_2)_b-O-CH_2-X \quad (2)$$

$$-Ar-O-(CH_2)_c-X \quad (3)$$

19 Claims, 1 Drawing Sheet

(51) Int. Cl.
    *C09D 11/102* (2014.01)
    *G09F 9/35* (2006.01)
    *H01L 27/32* (2006.01)
    *H01L 51/50* (2006.01)

(52) U.S. Cl.
    CPC ............ *G09F 9/35* (2013.01); *H01L 27/3232* (2013.01); *H01L 51/0043* (2013.01); *C08G 2261/124* (2013.01); *C08G 2261/1412* (2013.01); *C08G 2261/18* (2013.01); *C08G 2261/228* (2013.01); *C08G 2261/312* (2013.01); *C08G 2261/3162* (2013.01); *C08G 2261/3222* (2013.01); *C08G 2261/334* (2013.01); *C08G 2261/51* (2013.01); *C08G 2261/95* (2013.01); *H01L 51/5088* (2013.01)

(58) Field of Classification Search
    CPC .......... C08G 2261/18; C08G 2261/228; C08G 2261/312; C08G 2261/3162; C08G 2261/3222; C08G 2261/334; C08G 2261/51; C08G 2261/95; C09D 11/102; G09F 9/35; H01L 27/3232; H01L 51/0043; H01L 51/0035; H01L 51/5088; H01L 51/5048; H01L 51/0039; C09K 11/06; H01B 1/128; H05B 33/14; H01K 2211/1483

See application file for complete search history.

(56) References Cited

U.S. PATENT DOCUMENTS

| | | |
|---|---|---|
| 2009/0278445 A1 | 11/2009 | Jen et al. |
| 2009/0321723 A1 | 12/2009 | Hoshi |
| 2011/0198573 A1 | 8/2011 | Iida |
| 2012/0074360 A1 | 3/2012 | Funyuu et al. |
| 2013/0200337 A1 | 8/2013 | Koichiro et al. |
| 2014/0084279 A1 | 3/2014 | Tanaka et al. |
| 2015/0364718 A1 | 12/2015 | Huang |
| 2016/0329497 A1 | 11/2016 | Radu et al. |

FOREIGN PATENT DOCUMENTS

| | | |
|---|---|---|
| CN | 107078227 A | 8/2017 |
| CN | 109937490 A | 6/2019 |
| EP | 3106485 A1 | 12/2016 |
| JP | 2000-036390 A | 2/2000 |
| JP | 2003-213002 A | 7/2003 |
| JP | 2005-075948 A | 3/2005 |
| JP | 2006-279007 A | 10/2006 |
| JP | 2007-302886 A | 11/2007 |
| JP | 2008-063327 A | 3/2008 |
| JP | 2008-179790 A | 8/2008 |
| JP | 2008-198989 A | 8/2008 |
| JP | 2009-536656 A | 10/2009 |
| JP | 2009-283509 A | 12/2009 |
| JP | 2010-065213 A | 3/2010 |
| JP | 2010-155985 A | 7/2010 |
| JP | 2012-158669 A | 8/2012 |
| JP | 2013-036023 A | 2/2013 |
| JP | 2013-045986 A | 3/2013 |
| JP | 2013-124271 A | 6/2013 |
| JP | 2013-214565 A | 10/2013 |
| JP | 2014-019755 A | 2/2014 |
| JP | 2014-169418 A | 9/2014 |
| JP | 2015-017231 A | 1/2015 |
| JP | 2015-035629 A | 2/2015 |
| JP | 2015-159077 | 9/2015 |
| JP | 2016-167570 A | 9/2016 |
| KR | 2014-0015385 A | 2/2014 |
| TW | 201105703 A | 2/2011 |
| TW | 201139558 A | 11/2011 |
| TW | 201615687 A | 5/2016 |
| WO | 2008/010487 A1 | 1/2008 |
| WO | 2008/108162 A1 | 9/2008 |
| WO | 2011/099531 A1 | 8/2011 |
| WO | 2010/140553 A1 | 11/2012 |
| WO | 2013/002053 A1 | 1/2013 |
| WO | 2016/076375 A1 | 5/2016 |
| WO | 2017/079042 A1 | 5/2017 |

OTHER PUBLICATIONS

Md. A. Karim et al., "Synthesis and Characterization of Spirobifluorene-Based Polymers for Organic Light-Emitting Diode Applications", Macromolecular Research, vol. 16, No. 4, pp. 337-344 (2008) (cited in an search report in counterpart European Patent Application No. 17789309.6 dated Jan. 2, 2020).

Steffen Jungermann et al., "NovelPhoto-Cross-LinkableHole-TransportingPolymers: Synthesis, Characterization, and Application in Organic Light Emitting Diodes", Macromolecules 2006, vol. 39, No. 26, pp. 8911-8919 (cited in an search report in counterpart European Patent Application No. 17789309.6 dated Jan. 2, 2020).

Kango Hirose et al., 53rd Meeting of the Japan Society of Applied Physics and Related Societies, 26p-ZK-4 (2006).

Md. Anwarul Karim et al., Synthesis and Characterization of Spirobifluorene-Based Polymers for Organic Light-Emitting Diode Applications, Macromolecular Research, vol. 16, No. 4, pp. 337-344, 2008 (cited in a Search Report in counterpart European Appln. dated Jul. 2, 2020).

Steffen Jungermann et al., Articles, NovelPhoto-Cross-LinkableHole-TransportingPolymers:Synthesis, Characterization, and Application in Organic Light Emitting Diodes, Macromolecules 2006, 39, 8911-8919 (cited in a Search Report in counterpart European Appln. dated Jul. 2, 2020).

Database WPI, Week 201420, Thomson Scientific, London, GB; AN 2014-C36254, XP002796440, (cited in a Search Report in counterpart European Appln. dated Jul. 2, 2020).

Database WPI, Week 201316, Thomson Scientific, London, GB; AN 2013-C49055, XP002796441 (cited in a Search Report in counterpart European Appln. dated Jul. 2, 2020).

Endo, A., Ogasawara, M., Takahashi, A., Yokoyama, D., Kato, Y. and Adachi, C. (2009), Thermally Activated Delayed Fluorescence from Sn4+-Porphyrin Complexes and Their Application to Organic Light Emitting Diodes—A Novel Mechanism for Electroluminescence. Adv. Mater., 21: 4802-4806. doi:10.1002/adma.200900983 (Cited in Specification).

Endo, A., Sato, K., Yoshimura, K., Kai, T., Kawada, A., et al. (2011) Efficient up-conversion of triplet excitons into a singlet state and its application for organic light emitting diodes. Appl. Phys. Lett. 98, 083302 ; doi: 10.1063/1.3558906 (Cited in Specification).

Nakagawa, T., Ku, S., Wong, K., Adachi, C. Electroluminescence based on thermally activated delayed fluorescence generated by a spirobifluorene donor-acceptor structure. Chem. Commun., 48, 9580-9582 (2012) (Cited in Specification).

Lee, S., Yasuda, T., Nomura, H., and Adachi, C. High-efficiency organic light-emitting diodes utilizing thermally activated delayed fluorescence from triazine-based donor-acceptor hybrid molecules Appl. Phys. Lett. 101, 093306 (2012); doi: 10.1063/1.4749285 (Cited in Specification).

Zhang, Q., Li, J., Shizu, K,. Huang, S., Hirata, S., Miyazaki, H., and Adachi, C. Design of Efficient Thermally Activated Delayed Fluorescence Materials for Pure Blue Organic Light Emitting Diodes. J. Am. Chem. Soc., 134, 14706 (2012) (Cited in Specification).

(56) References Cited

OTHER PUBLICATIONS

Tanaka, H., Shizu, K., Miyazakiab, H., and Adachi, C. Efficient green thermally activated delayed fluorescence (TADF) from a phenoxazine-triphenyltriazine (PXZ-TRZ) derivative. Chem. Comm., 48, 11392 (2012) (Cited in Specification).

Uoyama, H., Goushi, K., Shizu, K., Nomura, H., and Adachi, C. Highly efficient organic light-emitting diodes from delayed fluorescence. Nature, 492, 234 (2012) (Cited in Specification).

Li, J., Nakagawa, T., MacDonald, J., Zhang, Q., Nomura, H., Miyazaki, H., and Adachi, C. Highly Efficient Organic Light-Emitting Diode Based on a Hidden Thermally Activated Delayed Fluorescence Channel in a Heptazine Derivative. Adv. Mater., 25, 3319 (2013) (Cited in Specification).

Ishimatsu, R., Matsunami, S., Shizu, K., Adachi, C., Nakano, K., and Imato, T. Solvent Effect on Thermally Activated Delayed Fluorescence by 1,2,3,5-Tetrakis(carbazol-9-yl)-4,6-dicyanobenzene J. Phys. Chem. A, 117, 5607 (2013) (Cited in Specification).

Serevicius, T., Nakagawa, T., Kuo, M., Cheng, S., Wong, K., Chang, C., Kwong, R. C., Xiae, S., and Adachi, C. Enhanced electroluminescence based on thermally activated delayed fluorescence from a carbazole-triazine derivative. Phys. Chem. Chem. Phys., 15, 15850 (2013) (Cited in Specification).

Nasu, K., Nakagawa, T., Nomura, H., Lin, C., Cheng, C., Tseng, M., Yasudaad, T., and Adachi, C. A highly luminescent spiro-anthracenone-based organic light-emitting diode exhibiting thermally activated delayed fluorescence Chem. Comm., 49, 10385 (2013) (Cited in Specification).

Li, B., Nomura, H., Miyazaki, H., Zhang, Q., Yoshida, K., Suzuma, Y., Orita, A., Otera, J., Adachi, C. Dicarbazolyldicyanobenzenes as Thermally Activated Delayed Fluorescence Emitters: Effect of Substitution Position on Photoluminescent and Electroluminescent Properties. Chem. Lett., 43, 319 (2014) (Cited in Specification).

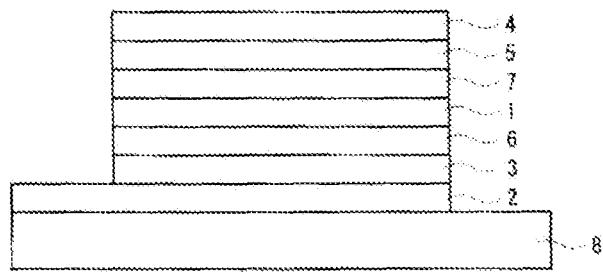

ORGANIC ELECTRONIC MATERIAL AND USE OF SAME

CROSS-REFERENCE TO RELATED APPLICATIONS

This application is a U.S. national phase application filed under 35 U.S.C. § 371 of International Application No. PCT/JP2018/007555, filed Feb. 28, 2018, designating the United States, which claims priority from Japanese Patent Application No. 2017-039341, filed Mar. 2, 2017, which are hereby incorporated herein by reference in their entirety.

TECHNICAL FIELD

The present invention relates to an organic electronic material and an ink composition that uses the material. Further, the present invention also relates to an organic electronic element, an organic electroluminescent element (hereafter also referred to as an organic EL element), a display element, an illumination device and a display device that use the above organic electronic material or ink composition.

BACKGROUND ART

Organic electronic elements are elements which use an organic substance to perform an electrical operation, and because they are expected to be capable of providing advantages such as low energy consumption, low prices and superior flexibility, they are attracting much attention as a potential alternative technology to conventional inorganic semiconductors containing mainly silicon. Examples of organic electronic elements include organic EL elements, organic photoelectric conversion elements, and organic transistors and the like.

Among organic electronic elements, organic EL elements are attracting attention for potential use in large-surface area solid state lighting source applications to replace incandescent lamps or gas-filled lamps or the like. Further, organic EL elements are also attracting attention as the leading self-luminous display for replacing liquid crystal displays (LCD) in the field of flat panel displays (FPD), and commercial products are becoming increasingly available.

Depending on the organic material used, organic EL elements can be broadly classified into two types: low-molecular weight type organic EL elements and polymer type organic EL elements. In polymer type organic EL elements, a polymer compound is used as the organic material, whereas in low-molecular weight type organic EL elements, a low-molecular weight compound is used.

The production methods for organic EL elements are broadly classified into dry processes in which film formation is mainly performed in a vacuum system, and wet processes in which film formation is performed by plate-based printing such as relief printing or intaglio printing, or by plateless printing such as inkjet printing. Compared with dry processes that require a vacuum system, wet processes enable simple film formation, and are therefore expected to be an indispensable method in the production of future large-screen organic EL displays.

Generally, organic EL elements produced by wet processes using polymer compounds have the advantages that cost reductions and increases in surface area can be achieved with relative ease. Accordingly, in recent years there has been much development of polymer compounds that are suitable for wet processes. Further, in order to improve the characteristics of organic EL elements, a variety of methods for achieving multilayering of organic layers are also being investigated.

For example, methods for multilayering organic layers by wet processes using polymer compounds having polymerizable functional groups are already known. In these methods, for example, a polymer compound having polymerizable functional groups is dissolved in a solvent, and following application of the thus obtained solution, the organic layer can be insolubilized by the application of light or heat, meaning another wet process can then be used to form an upper layer on top of the organic layer (for example, see Patent Document 1 and Patent Document 2).

PRIOR ART DOCUMENTS

Patent Documents

Patent Document 1: JP 2006-279007 A
Patent Document 2: WO 08/010487

DISCLOSURE OF INVENTION

Problems Invention Aims to Solve

On the other hand, with regards organic EL elements, further improvements in various characteristics such as the drive voltage and the lifespan characteristics would be desirable. For example, because conventional polymer compounds used in organic EL elements do not have satisfactory heat resistance, the organic layers are prone to degradation caused by the heating used during element production. Deterioration in the performance of organic layers due to this type of thermal degradation is one cause of problems such as an undesirable increase in the drive voltage and a deterioration in the lifespan characteristics. Accordingly, a polymer compound that is suitable for wet processes and also has excellent heat resistance would be very desirable.

Further, in wet processes, prior to coating of the substrate, a step of preparing a coating solution by dissolving the polymer compound in a solvent is generally required. Accordingly, favorable solubility of the polymer compound in the solvent that constitutes the coating solution (the coating solvent) becomes very important. When the solubility of the polymer compound is low, the lead time required to prepare the coating solution increases, and the production efficiency deteriorates. Further, in those cases where the solubility of the polymer compound is inadequate, problems caused by non-dissolution or precipitation of the polymer compound tend to occur more readily, and application of wet processes becomes difficult. Accordingly, a polymer compound having excellent solubility in the coating solvent is desirable.

As described above, even if a polymer compound is capable of improving the characteristics of an organic EL element, if the solubility of that compound in the coating solvent is inadequate, then effectively implementing a wet process becomes difficult. However, conventional polymer compounds are unable to adequately satisfy the requirements for achieving both favorable element characteristics such as heat resistance, and favorable process characteristics such as solubility and the like, and further improvements are required.

The present invention has been developed in light of the above circumstances, and has an object of providing an organic electronic material containing a charge transport compound having excellent heat resistance and excellent solubility in coating solvents.

Means for Solution of the Problems

As a result of intensive investigation, the inventors of the present invention discovered that an organic electronic material containing a charge transport compound having a specific structure was effective in improving the heat resistance and the solubility in solvents, enabling them to complete the present invention.

In other words, embodiments of the present invention relate to the following aspects. However, the present invention is not limited to the embodiments described below, and includes all manner of embodiments.

One embodiment relates to an organic electronic material containing a charge transport compound having at least one of the structural regions represented by formulas (1), (2) and (3) shown below.

  (1)

  (2)

  (3)

In the formulas, Ar represents an arylene group or heteroarylene group of 2 to 30 carbon atoms, a represents an integer of 1 to 6, b represents an integer of 2 to 6, c represents an integer of 2 to 6, and X represents a substituted or unsubstituted polymerizable functional group.

In the organic electronic material described above, the polymerizable functional group preferably includes at least one group selected from the group consisting of a substituted or unsubstituted oxetane group, epoxy group, vinyl group, acryloyl group and methacryloyl group.

The charge transport compound described above preferably has hole injection properties. Further, the charge transport compound preferably contains at least one structure selected from the group consisting of aromatic amine structures, carbazole structures, thiophene structures, benzene structures, phenoxazine structures and fluorene structures.

The charge transport compound described above is preferably a charge transport polymer, and the charge transport polymer preferably has at least one of the structural regions represented by formulas (1), (2) and (3) shown above at a terminal. Further, the charge transport compound described above preferably has a structure that is branched in three or more directions.

Another embodiment relates to an ink composition containing the organic electronic material described above and a solvent.

Another embodiment relates to an organic layer formed using the organic electronic material described above or the ink composition of the embodiment described above.

Another embodiment relates to an organic electronic element containing the organic layer described above.

Another embodiment relates to an organic electroluminescent element containing the organic layer described above.

Another embodiment relates to a display element containing the organic electroluminescent element described above.

Another embodiment relates to an illumination device containing the organic electroluminescent element described above.

Another embodiment relates to a display device containing the illumination device described above, and a liquid crystal element as a display unit.

The present application is related to the subject matter disclosed in prior Japanese Application 2017-039341 filed on Mar. 2, 2017, the entire contents of which are incorporated by reference herein.

Effects of the Invention

The present invention is able to provide an organic electronic material containing a charge transport compound having excellent heat resistance and excellent solubility in coating solvents. Further, an organic layer for which thermal degradation can be suppressed can be formed using the above organic electronic material or an ink composition containing the material. Furthermore, because the charge transport compound exhibits excellent solubility in coating solvents, an organic layer can be formed very efficiently using a wet process.

BRIEF DESCRIPTION OF THE DRAWINGS

FIG. 1 is a cross-sectional schematic view illustrating one embodiment of an organic EL element.

EMBODIMENTS FOR CARRYING OUT THE INVENTION

Embodiments of the present invention are described below in further detail, but the present invention is not limited to the following embodiments.
<Organic Electronic Material>

The organic electronic material contains a charge transport compound having at least one of the structural regions represented by formulas (1), (2) and (3) shown below.

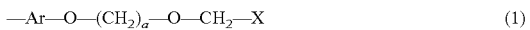  (1)

  (2)

  (3)

In the formulas, Ar represents an arylene group or heteroarylene group of 2 to 30 carbon atoms. Further, a, b and c each indicate the number of carbon atoms in the respective methylene chain (—CH$_2$—), wherein a represents an integer of 1 to 6, b represents an integer of 2 to 6, and c represents an integer of 2 to 6. Moreover, X represents a substituted or unsubstituted polymerizable functional group.

The organic electronic material may contain two or more types of the charge transport compound having the specific structural region described above, and may also contain another charge transport compound.
[Charge Transport Compound]

The charge transport compound has at least one structural unit having charge transport properties, and at least one of the structural units has at least one of the structural regions represented by formulas (1), (2) and (3) shown above. The structural regions represented by formulas (1), (2) and (3) are characterized by having a specific structure composed of an ether linkage and an alkylene chain as the linking portion between the Ar group and the polymerizable functional group X.

Charge transport compounds containing a structural region represented by —Ar—CH$_2$—O— at a terminal readily undergo intramolecular cleavage upon heating, and therefore tend to exhibit poor heat resistance. In contrast, charge transport compounds having at least one of the structural regions represented by the above formulas (1), (2) and (3) are unlikely to undergo intramolecular cleavage upon heating, and therefore have excellent heat resistance. Furthermore, charge transport compounds having at least one of the structural regions represented by formulas (1), (2) and (3) exhibit excellent solubility in coating solvents such as toluene. Accordingly, by forming an organic electronic material containing the above charge transport compound, a combination of excellent heat resistance and excellent solubility can be achieved.

In one embodiment, from the viewpoint of the heat resistance, the charge transport compound preferably exhibits a thermal weight reduction upon heating at 300° C. that is not more than 6% by mass relative to the mass prior to heating. This thermal weight reduction is more preferably not more than 5% by mass, and even more preferably 3.5% by mass or less.

In those cases where a specific charge transport polymer described below is used as the charge transport compound, the thermal weight reduction for the material can be more easily adjusted to a value within the above range. Here, the "thermal weight reduction upon heating at 300° C." refers to the thermal weight reduction (% by mass) when a 10 mg sample is heated in the air to 300° C. under temperature increase conditions of 5° C./minute. Measurement of this thermal weight reduction can be performed using a thermogravimetric-differential thermal analysis (TG-DTA) apparatus. As is evident from the examples described below, when the thermal weight reduction of the charge transport compound falls within the above range, any increase in the drive voltage can be easily suppressed. In one embodiment, the increase in the drive voltage is preferably less than 5.0 V, more preferably less than 3.0 V, and even more preferably less than 2.0 V.

Furthermore, in one embodiment, from the viewpoint of achieving excellent solubility, the dissolution time required under normal atmospheric conditions at room temperature (a temperature of 25° C.) to obtain a 1% organic solvent solution of the above charge transport compound is preferably not longer than 7 minutes. For example, when 8.8 mg of the charge transport compound is added to 1 mL of toluene under normal atmospheric conditions at room temperature, the dissolution time for the charge transport compound is preferably not longer than 7 minutes. This dissolution time is more preferably not longer than 6.5 minutes, and even more preferably 4 minutes or shorter. Here, the dissolution time means the time required, based on visual inspection, for the charge transport compound to dissolve in the toluene and form a transparent solution.

Each of the structural regions represented by the above formulas (1), (2) and (3) are described below in further detail.

Ar represents an arylene group or heteroarylene group of 2 to 30 carbon atoms. An arylene group means a group having a structure in which two hydrogen atoms have been removed from an aromatic hydrocarbon. A heteroarylene group means a group having a structure in which two hydrogen atoms have been removed from an aromatic heterocycle.

The aromatic hydrocarbon and aromatic heterocycle may be single ring structures such as benzene, or condensed ring structures such a naphthalene in which rings are bonded mutually together.

Specific examples of the aromatic hydrocarbon include benzene, naphthalene, anthracene, tetracene, fluorene and phenanthrene. Specific examples of the aromatic heterocycle include pyridine, pyrazine, quinoline, isoquinoline, acridine, phenanthroline, furan, pyrrole, thiophene, carbazole, oxazole, oxadiazole, thiadiazole, triazole, benzoxazole, benzoxadiazole, benzothiadiazole, benzotriazole and benzothiophene.

The aromatic hydrocarbon and aromatic heterocycle may also have a polycyclic structure in which two or more structures selected from among monocyclic and condensed ring structures are bonded together via single bonds. Examples of aromatic hydrocarbons having this type of polycyclic structure include biphenyl, terphenyl and triphenylbenzene. The aromatic hydrocarbon and aromatic heterocycle may each be unsubstituted, or may have one or more substituents. These substituents may be, for example, linear, cyclic or branched alkyl groups of 1 to 22 carbon atoms. This number of carbon atoms is more preferably from 1 to 15, even more preferably from 1 to 12, and still more preferably from 1 to 6. In one embodiment, Ar is preferably a phenylene group or a naphthylene group, and is more preferably a phenylene group.

In the structural regions represented by the above formulas (1), (2) and (3), X represents a polymerizable functional group. A "polymerizable functional group" refers to a functional group which is able to form bonds upon the application of heat and/or light. The polymerizable functional group X may be unsubstituted, or may have a substituent.

Specific examples of the polymerizable functional group X include groups having a carbon-carbon multiple bond (such as a vinyl group, allyl group, butenyl group, ethynyl group, acryloyl group, acryloylamino group, methacryloyl group, methacryloylamino group and vinylamino group), groups having a small ring (including cycloalkyl groups such as a cyclopropyl group and cyclobutyl group; cyclic ether groups such as an epoxy group (oxiranyl group) and oxetane group (oxetanyl group); diketene groups; episulfide groups; lactone groups; and lactam groups); and heterocyclic groups (such as a furanyl group, pyrrolyl group, thiophenyl group and silolyl group).

In particular, the polymerizable functional group X is preferably a substituted or unsubstituted vinyl group, acryloyl group, methacryloyl group, epoxy group or oxetane group. From the viewpoints of the reactivity and the characteristics of organic electronic elements, a substituted or unsubstituted vinyl group, oxetane group or epoxy group is more preferred. Moreover, from the viewpoint of storage stability, a substituted or unsubstituted oxetane group is preferred.

The polymerizable functional group may have a substituent. The substituent is preferably a linear, cyclic or branched saturated alkyl group of 1 to 22 carbon atoms. This number of carbon atoms is more preferably from 1 to 8, and even more preferably from 1 to 4. The substituent is most preferably a linear saturated alkyl group of 1 to 4 carbon atoms.

In one embodiment, from the viewpoint of the storage stability, the polymerizable functional group X is preferably a substituted or unsubstituted oxetane group represented by formula (X1) shown below. In the formula, R represents a hydrogen atom or a saturated alkyl group of 1 to 4 carbon atoms. It is particularly preferable that R is a methyl group or an ethyl group.

[Chemical formula 1]

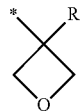

(X1)

The charge transport compound having at least one of the structural regions represented by the above formulas (1), (2) and (3) contains at least one polymerizable functional group X within the structure. Compounds containing a polymerizable functional group can be cured by a polymerization reaction, and the degree of solubility in solvents can be changed as a result of the curing. Accordingly, charge transport compounds having at least one structural region represented by formula (1), (2) or (3) are materials that have excellent curability and are suitable for use in wet processes.

Specific examples of the structural regions represented by the above formulas (1), (2) and (3) include the structures shown below.

[Chemical formula 2]

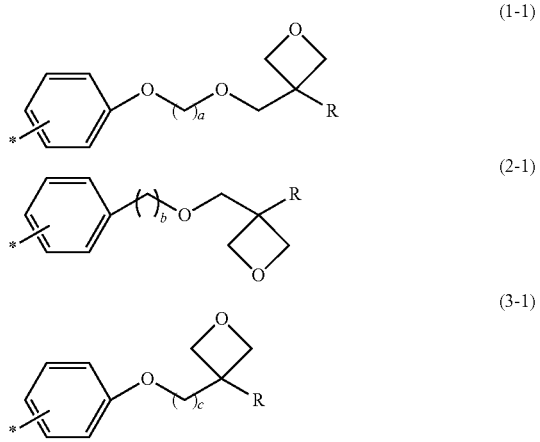

(1-1)

(2-1)

(3-1)

In the formulas, a is preferably an integer of 1 to 6, more preferably an integer of 2 to 6, and even more preferably an integer of 4 to 6. Further, b is preferably an integer of 2 to 6, more preferably an integer of 3 to 6, and even more preferably an integer of 4 to 6. Moreover, c is preferably an integer of 2 to 6, more preferably an integer of 3 to 6, and even more preferably an integer of 4 to 6.

There are no particular limitations on the charge transport compound, provided it has at least one of the structural regions represented by formulas (1), (2) and (3), and has the ability to transport an electric charge. The transported charge is preferably a positive hole. A compound having hole transport properties can be used as a hole injection layer or a hole transport layer of an organic EL element, whereas a compound having electron transport properties can be used as an electron transport layer or an electron injection layer. Further, a compound that transports both holes and electrons can be used as the material for a light-emitting layer or the like.

The charge transport compound has either one, or two or more, structural units having charge transport properties. Specific examples of structural units having charge transport properties and the preferred ranges for such structural units are the same as the specific examples and preferred ranges for the structural units of the "charge transport polymer" described below.

The charge transport compound may be a low-molecular weight compound having one structural unit, or a polymer compound (meaning a "polymer or oligomer") having a plurality of structural units. From the viewpoint of more easily obtaining a material of high purity, a low-molecular weight compound is preferred. From the viewpoints of facilitating the production of compositions and achieving superior film formability, a polymer compound is preferred. Moreover, from the viewpoint of achieving both sets of advantages, a mixture of a low-molecular weight compound and a polymer compound may also be used.

[Charge Transport Polymer]

In one embodiment, the charge transport compound may be a polymer or oligomer (hereafter jointly referred to as a "charge transport polymer").

The charge transport polymer has the ability to transport an electric charge, and has at least one of the structural regions represented by the above formulas (1), (2) and (3). The charge transport polymer may be linear, or may have a branched structure. The charge transport polymer contains at least a divalent structural unit L having charge transport properties and a monovalent structural unit T that constitutes the terminal portions, and preferably also contains a trivalent or higher structural unit B that constitutes a branched portion. The charge transport polymer may contain only one type of each of these structural units, or may contain a plurality of types of each structural unit.

In the charge transport polymer, the various structural units are bonded together at "monovalent" to "trivalent or higher" bonding sites.

At least one of the structural regions represented by the above formulas (1), (2) and (3) may be introduced at a terminal of the charge transport polymer (namely, a structural unit T), as a substituent at a portion other than a terminal (namely, a structural unit L or B), or at both a terminal and a portion other than a terminal. From the viewpoints of the curability, the structural region is preferably introduced at least at a terminal, and from the viewpoint of achieving a combination of favorable curability and charge transport properties, is preferably introduced only at terminals. Further, in those cases where the charge transport polymer has a branched structure, the structural region may be introduced within the main chain of the charge transport polymer, within a side chain, or within both the main chain and a side chain.

(Structure of Charge Transport Polymer)

Examples of partial structures contained in the charge transport polymer are described below. However, the charge transport polymer is not limited to polymers having the following partial structures. In the following partial structures, "L" represents a structural unit L, "T" represents a structural unit T, and "B" represents a structural unit B. The symbol "*" represents a bonding site with another structural unit. In the following partial structures, the plurality of L units may be the same structural unit or mutually different structural units. This also applies for the T and B units.

Example of Linear Charge Transport Polymer

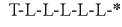 [Chemical Formula 3]

Examples of Charge Transport Polymers Having Branched Structures

[Chemical formula 4]

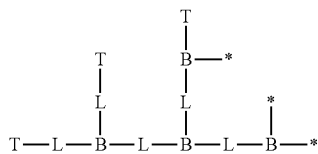

-continued

```
        T
        |
    T — B — *
    |   |
    L   L   *
    |   |   |
T—L—B—L—B—L—B—*
    |   |   |
    *   *   *
        T
        |
    T — B — *
    |   |
    L   L   *
    |   |   |
T—L—B—L—B—L—B—*
        |
        *
        T
        |
    B—L—L—*
    |
T—L—L—L—B—L—B—B—*
            |   |
            *   *
```

(Structural Unit L)

The structural unit L is a divalent structural unit having charge transport properties. There are no particular limitations on the structural unit L, provided it includes an atom grouping having the ability to transport an electric charge. For example, the structural unit L may be selected from among substituted or unsubstituted structures including aromatic amine structures, carbazole structures, thiophene structures, fluorene structures, benzene structures, biphenyl structures, terphenyl structures, naphthalene structures, anthracene structures, tetracene structures, phenanthrene structures, dihydrophenanthrene structures, pyridine structures, pyrazine structures, quinoline structures, isoquinoline structures, quinoxaline structures, acridine structures, diazaphenanthrene structures, furan structures, pyrrole structures, oxazole structures, oxadiazole structures, thiazole structures, thiadiazole structures, triazole structures, benzothiophene structures, benzoxazole structures, benzoxadiazole structures, benzothiazole structures, benzothiadiazole structures, benzotriazole structures, phenoxazine structures, and structures containing one, or two or more, of the above structures. The aromatic amine structures may be aniline structures, are preferably triarylamine structures, and are more preferably triphenylamine structures.

In one embodiment, from the viewpoint of obtaining superior hole transport properties, the structural unit L is preferably selected from among substituted or unsubstituted structures including aromatic amine structures, carbazole structures, thiophene structures, fluorene structures, benzene structures, phenoxazine structures, and structures containing one, or two or more, of these structures. In one embodiment, the benzene structures may form a portion of an aromatic amine structure such as a triphenylamine structure.

The structural unit L is more preferably selected from among substituted or unsubstituted structures including aromatic amine structures, thiophene structures, carbazole structures, fluorene structures, and structures containing one, or two or more, of these structures, is even more preferably selected from among substituted or unsubstituted structures including aromatic amine structures, carbazole structures, fluorene structures, and structures containing one, or two or more, of these structures, and is still more preferably selected from among substituted or unsubstituted structures including aromatic amine structures, carbazole structures, fluorene structures, and structures containing one, or two or more, of these structures.

In another embodiment, from the viewpoint of obtaining superior electron transport properties, the structural unit L is preferably selected from among substituted or unsubstituted structures including fluorene structures, benzene structures, phenanthrene structures, pyridine structures, quinoline structures, and structures containing one, or two or more, of these structures.

Specific examples of the structural unit L are shown below. However, the structural unit L is not limited to the following structures.

[Chemical formula 5]

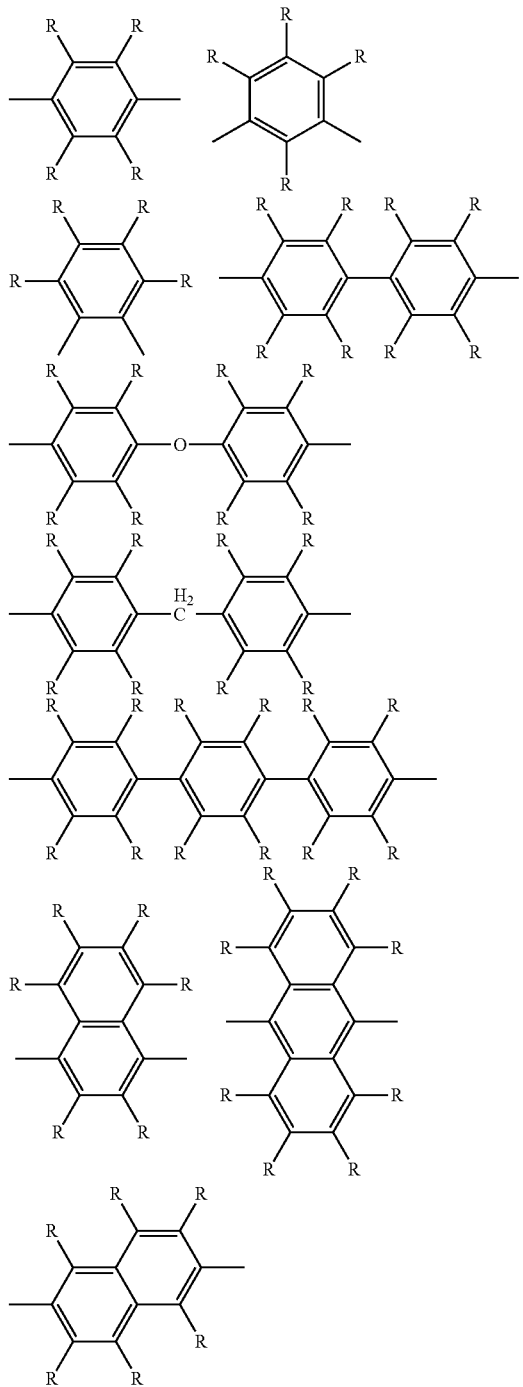

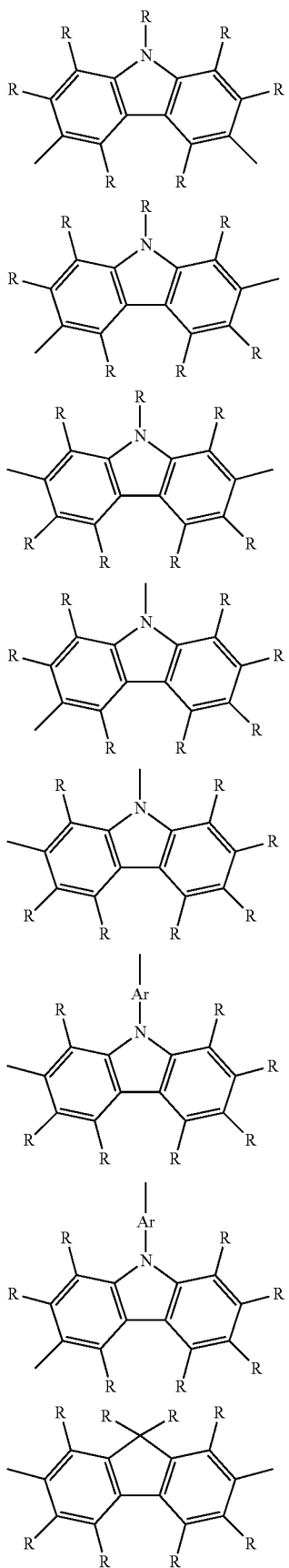
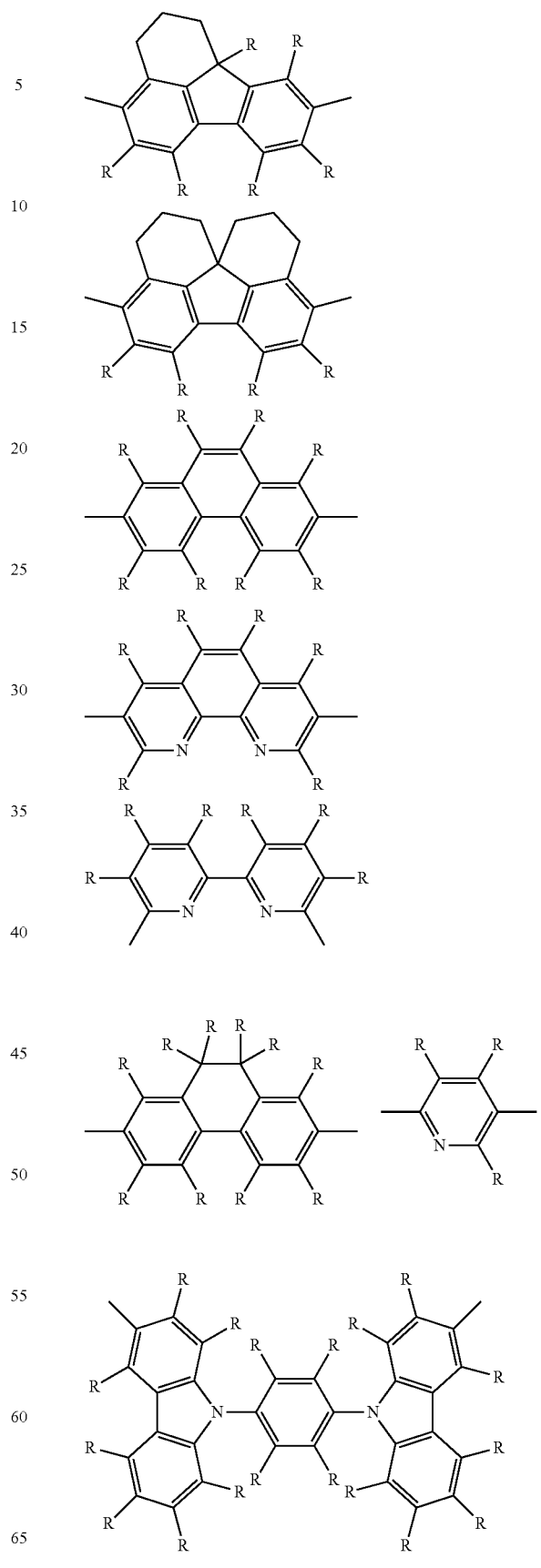

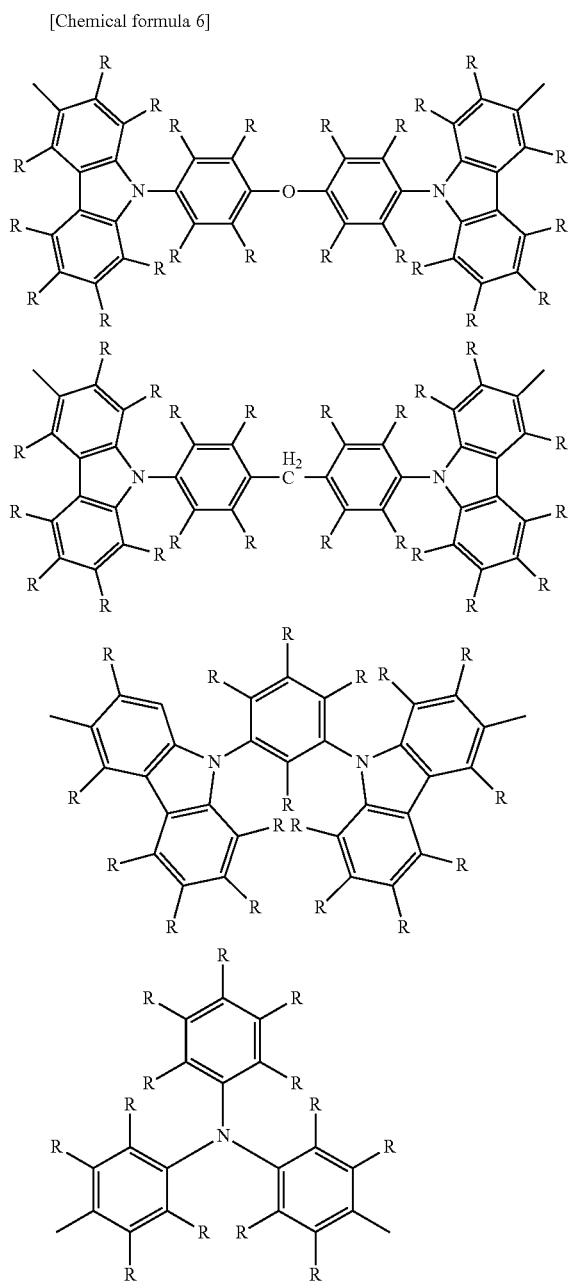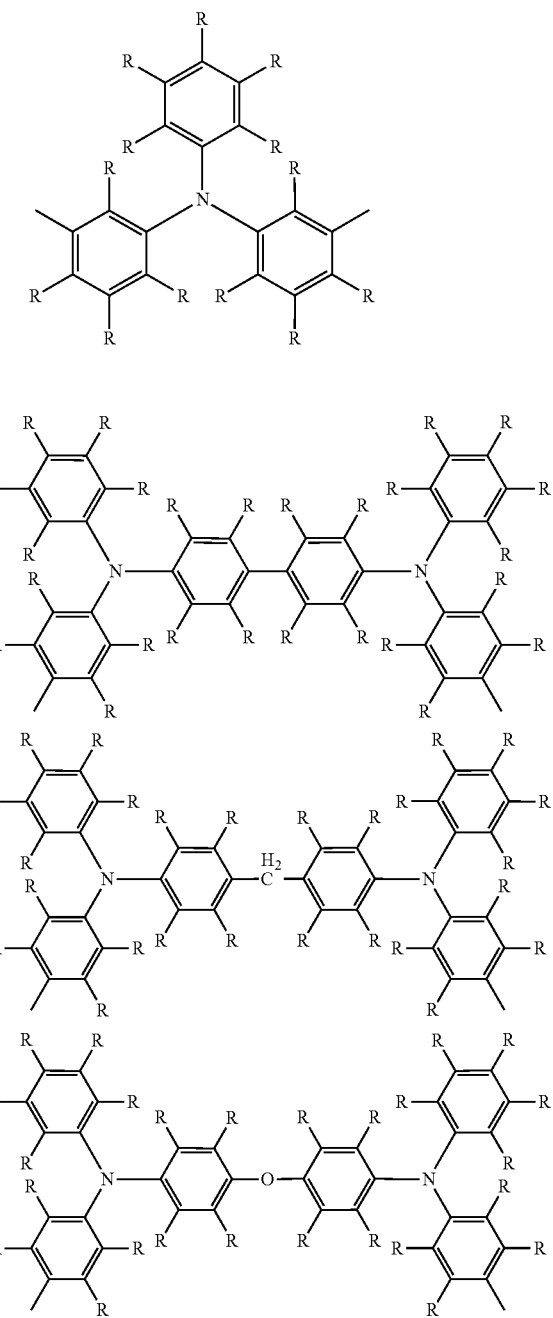

-continued

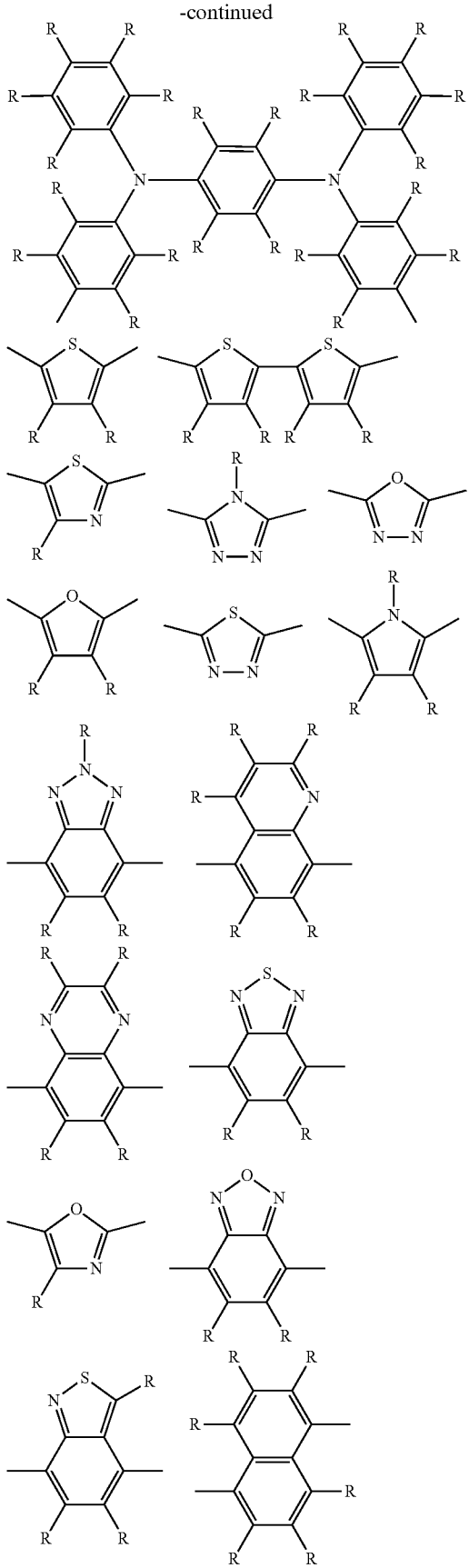

Each R independently represents a hydrogen atom or a substituent. In one embodiment, the substituent may be at least one of the structural regions represented by the above formulas (1), (2) and (3).

In another embodiment, each R is preferably independently selected from the group consisting of —$R^1$, —$OR^2$, —$SR^3$, —$OCOR^4$, —$COOR^4$, —$SiR^6R^7R^8$, halogen atoms, and the polymerizable functional groups X described above.

Each of $R^1$ to $R^8$ independently represents a hydrogen atom, a linear, cyclic or branched alkyl group of 1 to 22 carbon atoms, or an aryl group or heteroaryl group of 2 to 30 carbon atoms. An aryl group is an atom grouping in which one hydrogen atom has been removed from an aromatic hydrocarbon. A heteroaryl group is an atom grouping in which one hydrogen atom has been removed from an aromatic heterocycle. The alkyl group may be further substituted with an aryl group or heteroaryl group of 2 to 20 carbon atoms, and the aryl group or heteroaryl group may be further substituted with a linear, cyclic or branched alkyl group of 1 to 22 carbon atoms. R is preferably a hydrogen atom, an alkyl group, an aryl group, or an alkyl-substituted aryl group. Ar represents an arylene group or heteroarylene group of 2 to 30 carbon atoms. An arylene group is an atom grouping in which two hydrogen atoms have been removed from an aromatic hydrocarbon. A heteroarylene group is an atom grouping in which two hydrogen atoms have been removed from an aromatic heterocycle. Ar is preferably an arylene group, and is more preferably a phenylene group.

Examples of the aromatic hydrocarbon include monocyclic hydrocarbons, condensed ring hydrocarbons, and polycyclic hydrocarbons in which two or more hydrocarbons selected from among monocyclic hydrocarbons and condensed ring hydrocarbons are bonded together via single bonds. Examples of the aromatic heterocycles include monocyclic heterocycles, condensed ring heterocycles, and polycyclic heterocycles in which two or more heterocycles selected from among monocyclic heterocycles and condensed ring heterocycles are bonded together via single bonds.

(Structural Unit T)

The structural unit T is a monovalent structural unit that constitutes a terminal portion of the charge transport polymer. There are no particular limitations on the structural unit T, which may be selected from among substituted or unsubstituted structures including aromatic hydrocarbon structures, aromatic heterocyclic structures, and structures containing one, or two or more, of these structures. The structural unit T may have a similar structure to the structural unit L. In one embodiment, from the viewpoint of imparting durability to the polymer without impairing the charge transport properties, the structural unit T is preferably a substituted or unsubstituted aromatic hydrocarbon structure, and is more preferably a substituted or unsubstituted benzene structure. Of the various possibilities, from the viewpoint of enhancing the curability, the charge transport polymer preferably has a polymerizable functional group at a terminal.

From these types of viewpoints, in one embodiment, the charge transport polymer preferably has at least one of the aforementioned structural regions represented by the above formulas (1), (2) and (3) as a structural unit T1, and more preferably has at least one of the structural regions represented by the above formulas (1-1), (2-1) and (3-1).

In one embodiment, from the viewpoint of enhancing both the heat resistance and the solubility of the charge transport polymer, the proportion of structural regions represented by the above formulas (1), (2) and (3) (the structural unit T1), based on the total of all of the structural units T, is preferably at least 50 mol %, more preferably at least 75 mol %, and even more preferably 85 mol % or greater. This proportion of the structural unit T1 may be 100 mol %.

(Structural Unit B)

The structural unit B is a trivalent or higher structural unit that constitutes a branched portion in those cases where the charge transport polymer has a branched structure. From the viewpoint of improving the durability of organic electronic elements, the structural unit B is preferably not higher than hexavalent, and is more preferably either trivalent or tetravalent. The structural unit B is preferably a unit that has charge transport properties. For example, from the viewpoint of improving the durability of organic electronic elements, the structural unit B is preferably selected from among substituted or unsubstituted structures including aromatic amine structures, carbazole structures, condensed polycyclic aromatic hydrocarbon structures, and structures containing one, or two or more, of these structures.

Specific examples of the structural unit B are shown below. However, the structural unit B is not limited to the following structures.

[Chemical formula 7]

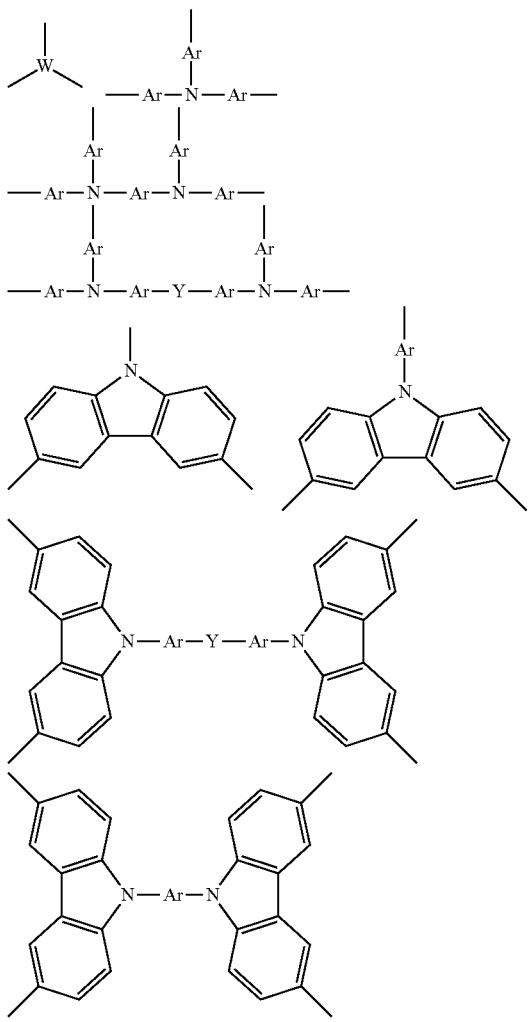

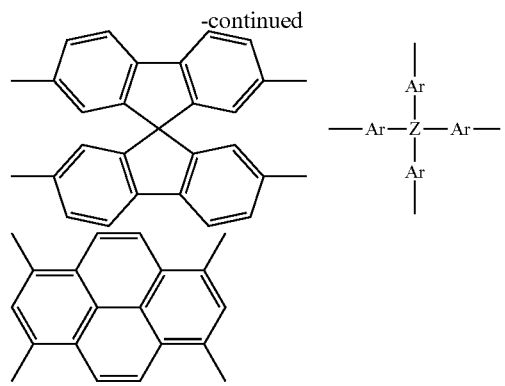

W represents a trivalent linking group, and for example, represents an arenetriyl group or heteroarenetriyl group of 2 to 30 carbon atoms. An arenetriyl group is an atom grouping in which three hydrogen atoms have been removed from an aromatic hydrocarbon. A heteroarenetriyl is an atom grouping in which three hydrogen atoms have been removed from an aromatic heterocycle. Each Ar independently represents a divalent linking group, and for example, may represent an arylene group or heteroarylene group of 2 to 30 carbon atoms. Ar preferably represents an arylene group, and more preferably a phenylene group.

Y represents a divalent linking group, and examples include divalent groups in which an additional hydrogen atom has been removed from any of the R groups having one or more hydrogen atoms described in relation to the structural unit L (but excluding those cases where R is a polymerizable functional group X or a structural region represented by any of formulas (1), (2) and (3)).

Z represents a carbon atom, a silicon atom or a phosphorus atom. In the structural units, the benzene rings and Ar groups may have a substituent, and examples of the substituent include the R groups in the structural unit L. In one embodiment, the structural unit B may have at least one of the structural regions represented by formulas (1), (2) and (3) as a substituent.

(Number Average Molecular Weight)

The number average molecular weight of the charge transport polymer can be adjusted appropriately with due consideration of the solubility in solvents and the film formability and the like. From the viewpoint of ensuring superior charge transport properties, the number average molecular weight is preferably at least 500, more preferably at least 1,000, and even more preferably 2,000 or greater. Further, from the viewpoints of maintaining favorable solubility in solvents and facilitating the preparation of ink compositions, the number average molecular weight is preferably not more than 1,000,000, more preferably not more than 100,000, and even more preferably 50,000 or less.

(Weight Average Molecular Weight)

The weight average molecular weight of the charge transport polymer can be adjusted appropriately with due consideration of the solubility in solvents and the film formability and the like. From the viewpoint of ensuring superior charge transport properties, the weight average molecular weight is preferably at least 1,000, more preferably at least 5,000, and even more preferably 10,000 or greater. Further, from the viewpoints of maintaining favorable solubility in solvents and facilitating the preparation of ink compositions, the weight average molecular weight is preferably not more than 1,000,000, more preferably not more than 700,000, and even more preferably 400,000 or less.

The number average molecular weight and the weight average molecular weight can be measured by gel permeation chromatography (GPC) under the conditions described below, using a calibration curve of standard polystyrenes.

Feed pump: LC-20AD, manufactured by Shimadzu Corporation

UV-Vis detector: SPD-M20A, manufactured by Shimadzu Corporation Columns: Gelpack (a registered trademark) GL-A160S/GL-A150S, manufactured by Hitachi Chemical Co., Ltd.

Eluent: THF (for HPLC, contains stabilizers), manufactured by Wako Pure Chemical Industries, Ltd.

Flow rate: 1 mL/min

Column temperature: room temperature

Molecular weight standards: standard polystyrenes (Proportions of Structural Units)

From the viewpoint of obtaining satisfactory charge transport properties, the proportion of the structural unit L contained in the charge transport polymer, based on the total of all the structural units, is preferably at least 10 mol %, more preferably at least 20 mol %, and even more preferably 30 mol % or greater. Further, if the structural unit T and the optionally included structural unit B are taken into consideration, then the proportion of the structural unit L is preferably not more than 95 mol %, more preferably not more than 90 mol %, and even more preferably 85 mol % or less.

From the viewpoint of improving the characteristics of organic electronic elements, or from the viewpoint of suppressing any increase in viscosity and enabling more favorable synthesis of the charge transport polymer, the proportion of the structural unit T contained in the charge transport polymer, based on the total of all the structural units, is preferably at least 5 mol %, more preferably at least 10 mol %, and even more preferably 15 mol % or greater. Further, from the viewpoint of ensuring satisfactory charge transport properties, the proportion of the structural unit T is preferably not more than 60 mol %, more preferably not more than 55 mol %, and even more preferably 50 mol % or less.

In those cases where the charge transport polymer includes a structural unit B, from the viewpoint of improving the durability of organic electronic elements, the proportion of the structural unit B, based on the total of all the structural units, is preferably at least 1 mol %, more preferably at least 5 mol %, and even more preferably 10 mol % or greater. Further, from the viewpoints of suppressing any increase in viscosity and enabling more favorable synthesis of the charge transport polymer, or from the viewpoint of obtaining satisfactory charge transport properties, the proportion of the structural unit B is preferably not more than 50 mol %, more preferably not more than 40 mol %, and even more preferably 30 mol % or less.

Considering the balance between the charge transport properties, the durability, and the productivity and the like, the ratio (molar ratio) between the structural unit L and the structural unit T is preferably L:T=100:(1 to 70), more preferably 100:(3 to 50), and even more preferably 100:(5 to 30). Further, in those cases where the charge transport polymer also includes the structural unit B, the ratio (molar ratio) between the structural unit L, the structural unit T and the structural unit B is preferably L:T:B=100:(10 to 200):(10 to 100), more preferably 100:(20 to 180):(20 to 90), and even more preferably 100:(40 to 160):(30 to 80).

The proportion of a structural unit can be determined from the amount added of the monomer corresponding with that structural unit during synthesis of the charge transport polymer. Further, the proportion of each structural unit can also be calculated as an average value using the integral of the spectrum attributable to the structural unit in the $^1$H-NMR spectrum of the charge transport polymer. In terms of simplicity, if the amount added of the monomer is clear, then the proportion of the structural unit preferably employs the value determined using the amount added of the monomer.

When the charge transport polymer is a hole transport compound, from the viewpoints of obtaining superior hole injection properties and hole transport properties, the polymer preferably has at least one of a unit having an aromatic amine structure and a unit having a carbazole structure as a main structural unit. From these viewpoints, the proportion of the total number of units of at least one of a unit having an aromatic amine structure and a unit having a carbazole structure, relative to the total of all the structural units that constitute the charge transport polymer (but excluding terminal structural units), is preferably at least 40%, more preferably at least 45%, and even more preferably 50% or greater. This proportion of the total number of units of at least one of a unit having an aromatic amine structure and a unit having a carbazole structure may be 100%.

The charge transport polymer having at least one of the structural regions represented by the above formulas (1), (2) and (3) contains a polymerizable functional group X within the molecule. From the viewpoint of contributing to a change in the degree of solubility, the polymerizable functional group is preferably included in the charge transport polymer in a large amount. On the other hand, from the viewpoint of not impeding the charge transport properties, the amount included in the charge transport polymer is preferably kept small. The amount of the polymerizable functional group may be set as appropriate with due consideration of these factors.

For example, from the viewpoint of obtaining a satisfactory change in the degree of solubility, the number of polymerizable functional groups per molecule of the charge transport polymer is preferably at least 2, and more preferably 3 or greater. Further, from the viewpoint of maintaining favorable charge transport properties, the number of polymerizable functional groups is preferably not more than 1,000, and more preferably 500 or fewer. Here, the number of polymerizable functional groups means the total of the polymerizable functional groups X contained in the structural regions represented by formulas (1), (2) and (3), and polymerizable functional groups that exist within other structural regions.

The number of polymerizable functional groups per molecule of the charge transport polymer can be determined as an average value using the amount of the polymerizable functional group used in synthesizing the charge transport polymer (for example, the amount added of the monomer having the polymerizable functional group), the amounts added of the monomers corresponding with the various structural units, and the weight average molecular weight of the charge transport polymer and the like.

Further, the number of polymerizable functional groups can also be calculated as an average value using the ratio between the integral of the signal attributable to the polymerizable functional group and the integral of the total spectrum in the $^1$H-NMR (nuclear magnetic resonance) spectrum of the charge transport polymer, and the weight average molecular weight of the charge transport polymer and the like. In terms of simplicity, if the amounts added of the various components are clear, then the value determined using these amounts is preferably employed.

In one embodiment, from the viewpoint of ensuring efficient curing of the charge transport polymer, the proportion of the polymerizable functional group in the charge transport polymer, based on the total of all the structural units, is preferably at least 0.1 mol %, more preferably at least 1 mol %, and even more preferably 3 mol % or greater. Further, from the viewpoint of obtaining favorable charge transport properties, the proportion of the polymerizable functional group is preferably not more than 70 mol %, more preferably not more than 60 mol %, and even more preferably 50 mol % or less. Here, the "proportion of the polymerizable functional group" means the proportion of structural units having a polymerizable functional group.

(Production Method)

The charge transport polymer can be produced by various synthesis methods, and there are no particular limitations. For example, conventional coupling reactions such as the Suzuki coupling, Negishi coupling, Sonogashira coupling, Stille coupling and Buchwald-Hartwig coupling reactions can be used. The Suzuki coupling is a reaction in which a cross-coupling reaction is initiated between an aromatic boronic acid derivative and an aromatic halide using a Pd catalyst. By using a Suzuki coupling, the charge transport polymer can be produced easily by bonding together the desired aromatic rings.

In the coupling reaction, a Pd(0) compound, Pd(II) compound, or Ni compound or the like is used as a catalyst. Further, a catalyst species generated by mixing a precursor such as tris(dibenzylideneacetone)dipalladium(0) or palladium(II) acetate with a phosphine ligand can also be used. Reference may also be made to WO 2010/140553 in relation to synthesis methods for the charge transport polymer.

[Dopant]

The organic electronic material may also contain a dopant. There are no particular limitations on the dopant, provided it is a compound that yields a doping effect upon addition to the organic electronic material, enabling an improvement in the charge transport properties. Doping includes both p-type doping and n-type doping. In p-type doping, a substance that functions as an electron acceptor is used as the dopant, whereas in n-type doping, a substance that functions as an electron donor is used as the dopant.

To improve the hole transport properties, p-type doping is preferably used, whereas to improve the electron transport properties, n-type doping is preferably used. The dopant used in the organic electronic material may be a dopant that exhibits either a p-type doping effect or an n-type doping effect. Further, a single type of dopant may be added alone, or a mixture of a plurality of dopant types may be added.

The dopants used in p-type doping are electron-accepting compounds, and examples include Lewis acids, protonic acids, transition metal compounds, ionic compounds, halogen compounds and π-conjugated compounds. Specific examples include Lewis acids such as $FeCl_3$, $PF_5$, $AsF_5$, $SbF_5$, $BF_5$, $BCl_3$ and $BBr_3$; protonic acids, including inorganic acids such as HF, HCl, HBr, $HNO_3$, $H_2SO_4$ and $HClO_4$, and organic acids such as benzenesulfonic acid, p-toluenesulfonic acid, dodecylbenzenesulfonic acid, polyvinylsulfonic acid, methanesulfonic acid, trifluoromethanesulfonic acid, trifluoroacetic acid, 1-butanesulfonic acid, vinylphenylsulfonic acid and camphorsulfonic acid; transition metal compounds such as FeOCl, $TiCl_4$, $ZrCl_4$, $HfCl_4$, $NbF_5$, $AlCl_3$, $NbCl_5$, $TaCl_5$ and $MoF_5$; ionic compounds, including salts containing a perfluoro anion such as a tetrakis(pentafluorophenyl)borate ion, tris(trifluoromethanesulfonyl)methide ion, bis(trifluoromethanesulfonyl)imide ion, hexafluoroantimonate ion, $AsF_6^-$ (hexafluoroarsenate ion), $BF_4^-$ (tetrafluoroborate ion) or $PF_6^-$ (hexafluorophosphate ion), and salts having a conjugate base of an aforementioned protonic acid as an anion; halogen compounds such as $Cl_2$, $Br_2$, $I_2$, ICl, $ICl_3$, IBr and IF; and π-conjugated compounds such as TCNE (tetracyanoethylene) and TCNQ (tetracyanoquinodimethane). Further, the electron-accepting compounds disclosed in JP 2000-36390 A, JP 2005-75948 A, and JP 2003-213002 A and the like can also be used. Among the above dopants, Lewis acids, ionic compounds, and π-conjugated compounds and the like are preferred, and ionic compounds are more preferred. Among the various ionic compounds, onium salts are particularly desirable. An onium salt means a compound composed of a cation portion containing an onium ion such as an iodonium or ammonium ion, and a counter anion portion.

The dopants used in n-type doping are electron-donating compounds, and examples include alkali metals such as Li and Cs; alkaline earth metals such as Mg and Ca; salts of at least one alkali metal and/or alkaline earth metal such as LiF and $Cs_2CO_3$; metal complexes; and electron-donating organic compounds.

In order to make it easier to change the degree of solubility of the organic layer, the use of a compound that can function as a polymerization initiator for the polymerizable functional group as the dopant is preferred. Examples of materials that combine a function as a dopant and a function as a polymerization initiator include the ionic compounds described above.

[Other Optional Components]

The organic electronic material may also contain charge transport low-molecular weight compounds and other polymers and the like.

[Contents]

From the viewpoint of obtaining favorable charge transport properties, the amount of the charge transport material, relative to the total mass of the organic electronic material, is preferably at least 50% by mass, more preferably at least 70% by mass, and even more preferably 80% by mass or greater. The amount may be 100% by mass.

When a dopant is included, from the viewpoint of improving the charge transport properties of the organic electronic material, the amount of the dopant relative to the total mass of the organic electronic material is preferably at least 0.01% by mass, more preferably at least 0.1% by mass, and even more preferably 0.5% by mass or greater. Further, from the viewpoint of maintaining favorable film formability, the amount of the dopant relative to the total mass of the organic electronic material is preferably not more than 50% by mass, more preferably not more than 30% by mass, and even more preferably 20% by mass or less.

[Polymerization Initiator]

The organic electronic material of the present embodiment preferably contains a polymerization initiator. Conventional radical polymerization initiators, cationic polymerization initiators, and anionic polymerization initiators and the like can be used as the polymerization initiator. From the viewpoint of enabling simple preparation of ink compositions, the use of a substance that exhibits both a function as a dopant and a function as a polymerization initiator is preferred. For example, the ionic compounds described above can be used favorably as cationic polymerization initiators that also function as a dopant. Examples include salts of a perfluoro anion and a cation such as an iodonium ion or ammonium ion. Specific examples of onium salts include the compounds shown below.

[Chemical formula 8]

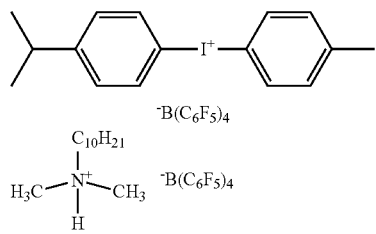

<Ink Composition>

The organic electronic material may be used in the form of an ink composition containing the organic electronic material of the embodiment described above and a solvent capable of dissolving or dispersing the material. By forming and using the ink composition, an organic layer can be formed easily using a simple coating method.

[Solvent]

Water, organic solvents, or mixed solvents thereof can be used as the solvent. Examples of the organic solvent include alcohols such as methanol, ethanol and isopropyl alcohol; alkanes such as pentane, hexane and octane; cyclic alkanes such as cyclohexane; aromatic hydrocarbons such as benzene, toluene, xylene, mesitylene, tetralin and diphenylmethane; aliphatic ethers such as ethylene glycol dimethyl ether, ethylene glycol diethyl ether and propylene glycol-1-monomethyl ether acetate; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole and 2,4-dimethylanisole; aliphatic esters such as ethyl acetate, n-butyl acetate, ethyl lactate and n-butyl lactate; aromatic esters such as phenyl acetate, phenyl propionate, methyl benzoate, ethyl benzoate, propyl benzoate and n-butyl benzoate; amide-based solvents such as N,N-dimethylformamide and N,N-dimethylacetamide; as well as dimethyl sulfoxide, tetrahydrofuran, acetone, chloroform and methylene chloride and the like. Preferred solvents include aromatic hydrocarbons, aliphatic esters, aromatic esters, aliphatic ethers, and aromatic ethers and the like. Among these, aromatic hydrocarbons, aliphatic esters, aromatic esters, aliphatic ethers and aromatic ethers and the like are particularly desirable.

As illustrated by the examples described below, the charge transport polymer that constitutes the above organic electronic material exhibits excellent solubility in toluene. From this type of viewpoint, although not a particular restriction, in one embodiment, the solvent is preferably an aromatic hydrocarbon, and of these, toluene is preferred. However, the charge transport polymer described above also exhibits excellent solubility in other organic solvents, including aromatic hydrocarbons other than toluene, aromatic ethers, aromatic esters, amide-based solvents, dimethyl sulfoxide, tetrahydrofuran, chloroform and methylene chloride. Accordingly, ink compositions can be prepared easily by mixing the organic electronic material with any of various organic solvents. In one embodiment, the ink composition preferably contains an organic electronic material containing the charge transport polymer described above, and an aromatic hydrocarbon such as toluene.

[Additives]

The ink composition may also contain additives as optional components. Examples of these additives include polymerization inhibitors, stabilizers, thickeners, gelling agents, flame retardants, antioxidants, reduction inhibitors, oxidizing agents, reducing agents, surface modifiers, emulsifiers, antifoaming agents, dispersants and surfactants.

[Contents]

The amount of the solvent in the ink composition can be determined with due consideration of the use of the composition in various coating methods. For example, the amount of the solvent is preferably an amount that yields a ratio of the charge transport polymer relative to the solvent that is at least 0.1% by mass, more preferably at least 0.2% by mass, and even more preferably 0.5% by mass or greater. Further, the amount of the solvent is preferably an amount that yields a ratio of the charge transport polymer relative to the solvent that is not more than 20% by mass, more preferably not more than 15% by mass, and even more preferably 10% by mass or less.

<Organic Layer>

In one embodiment, an organic layer is a layer formed using the organic electronic material of the embodiment described above. The organic electronic material of the above embodiment may also be used in the form of an ink composition. By using an ink composition, the organic layer can be formed favorably by a coating method. Examples of the coating method include conventional methods such as spin coating methods; casting methods; dipping methods; plate-based printing methods such as relief printing, intaglio printing, offset printing, lithographic printing, relief reversal offset printing, screen printing and gravure printing; and plateless printing methods such as inkjet methods. When the organic layer is formed by a coating method, the organic layer (coating layer) obtained following coating may be dried using a hot plate or an oven to remove the solvent.

The degree of solubility of the organic layer may be changed by using light irradiation or a heat treatment or the like to cause a polymerization reaction of the charge transport material. By stacking organic layers having changed degrees of solubility, multilayering of an organic electronic element can be performed with ease. Reference may also be made to WO 2010/140553 in relation to the method used for forming the organic layers.

From the viewpoint of improving the efficiency of charge transport, the thickness of the organic layer obtained following drying or curing is preferably at least 0.1 nm, more preferably at least 1 nm, and even more preferably 3 nm or greater. Further, from the viewpoint of reducing the electrical resistance, the thickness of the organic layer is preferably not more than 300 nm, more preferably not more than 200 nm, and even more preferably 100 nm or less.

As the heat resistance of the organic electronic material of the embodiment described above is improved, thermal degradation of the organic layer caused by high-temperature processes during element production is suppressed, and therefore the performance of the organic layer can be more easily maintained. Further, as the solubility of the charge transport compound improves, the organic electronic material becomes more suited to wet processes. In particular, in those cases where an organic electronic material containing a charge transport polymer having at least one of the structural regions represented by the above formulas (1), (2) and (3) is used to form an organic layer by a coating method, the coating solution (ink composition) can be prepared efficiently, and even if the organic layer is subjected to a bake treatment at high temperature following film formation, any deterioration in the performance of the organic layer can be suppressed, and superior carrier mobility can be maintained. As a result, thermal degradation during element production is ameliorated, and any deterioration in conductivity can be suppressed. Furthermore, by improving the heat resistance of the charge transport polymer, the drive voltage and the lifespan characteristics of elements can also be improved.

<Organic Electronic Element>

In one element, an organic electronic element has at least the organic layer of the embodiment described above. Examples of the organic electronic element include an organic EL element, an organic photoelectric conversion element, and an organic transistor. The organic electronic element preferably has at least a structure in which the organic layer is disposed between a pair of electrodes.

[Organic EL Element]

In one embodiment, an organic EL element has at least the organic layer of the embodiment described above. The organic EL element typically includes a light-emitting layer, an anode, a cathode and a substrate, and if necessary, may also have other functional layers such as a hole injection layer, electron injection layer, hole transport layer and electron transport layer. Each layer may be formed by a vapor deposition method, or by a coating method. The organic EL element preferably has the organic layer as the light-emitting layer or as another functional layer. The organic EL element more preferably has the organic layer as a functional layer, and even more preferably has the organic layer as at least one of a hole injection layer and a hole transport layer.

FIG. 1 is a cross-sectional schematic view illustrating one embodiment of the organic EL element. The organic EL element illustrated in FIG. 1 is an element with a multilayer structure, and has a substrate 8, an anode 2, a hole injection layer 3, a hole transport layer 6, a light-emitting layer 1, an electron transport layer 7, an electron injection layer 5 and a cathode 4 provided in that order. Each of these layers is described below.

In one embodiment, in the organic EL element illustrated in FIG. 1, the hole injection layer 3 and the hole transport layer 6 may be organic layers formed using the organic electronic material described above. In another embodiment, the organic EL element is not limited to the above structure, and another organic layer may be an organic layer formed using the organic electronic material described above.

[Light-Emitting Layer]

Examples of materials that can be used for the light-emitting layer include low-molecular weight compounds, polymers, and dendrimers and the like. Polymers exhibit good solubility in solvents, meaning they are suitable for coating methods, and are consequently preferred. Examples of the light-emitting material include fluorescent materials, phosphorescent materials, and thermally activated delayed fluorescent materials (TADF).

Specific examples of the above fluorescent materials include low-molecular weight compounds such as perylene, coumarin, rubrene, quinacridone, stilbene, color laser dyes, aluminum complexes, and derivatives of these compounds; polymers such as polyfluorene, polyphenylene, polyphenylenevinylene, polyvinylcarbazole, fluorene-benzothiadiazole copolymers, fluorene-triphenylamine copolymers, and derivatives of these compounds; and mixtures and the like of the above materials.

Examples of materials that can be used as the above phosphorescent materials include metal complexes and the like containing a metal such as Ir or Pt or the like. Specific examples of Ir complexes include FIr(pic) (iridium(III) bis[(4,6-difluorophenyl)-pyridinato-N,$C^2$]picolinate) which emits blue light, Ir(ppy)$_3$ (fac-tris(2-phenylpyridine)iridium) which emits green light, and (btp)$_2$Ir(acac) (bis[2-(2'-benzo[4,5-α]thienyl)pyridinato-N,$C^{3'}$]iridium(acetyl-acetonate))
and Ir(piq)$_3$ (tris(1-phenylisoquinoline)iridium) which emit red light. Specific examples of Pt complexes include PtOEP (2,3,7,8,12,13,17,18-octaethyl-21H,23H-porphyrin-platinum) which emits red light.

When the light-emitting layer contains an aforementioned phosphorescent material, a host material is preferably also included in addition to the phosphorescent material. Low-molecular weight compounds, polymers, and dendrimers can be used as this host material.

Examples of the low-molecular weight compounds include CBP (4,4'-bis(9H-carbazol-9-yl)-biphenyl), mCP (1,3-bis(9-carbazolyl)benzene), CDBP (4,4'-bis(carbazol-9-yl)-2,2'-dimethylbiphenyl), and derivatives of these compounds. Examples of the polymers include the organic electronic material of the embodiment described above, polyvinylcarbazole, polyphenylene, polyfluorene, and derivatives of these polymers.

Examples of the thermally activated delayed fluorescent materials include the compounds disclosed in Adv. Mater., 21, 4802-4906 (2009); Appl. Phys. Lett., 98, 083302 (2011); Chem. Comm., 48, 9580 (2012); Appl. Phys. Lett., 101, 093306 (2012); J. Am. Chem. Soc., 134, 14706 (2012); Chem. Comm., 48, 11392 (2012); Nature, 492, 234 (2012); Adv. Mater., 25, 3319 (2013); J. Phys. Chem. A, 117, 5607 (2013); Phys. Chem. Chem. Phys., 15, 15850 (2013); Chem. Comm., 49, 10385 (2013); and Chem. Left., 43, 319 (2014) and the like.

[Hole Transport Layer, Hole Injection Layer]

In one embodiment, in the organic EL element illustrated in FIG. 1, the hole injection layer 3 and the hole transport layer 6 are organic layers formed using the organic electronic material described above. However, embodiments of the organic EL element are not limited to this type of structure, and one or more other organic layers may be formed using the organic electronic material described above. The organic layer formed using the organic electronic material described above is preferably used as at least one of a hole transport layer and a hole injection layer, and is more preferably used as at least a hole transport layer. For example, in those cases where the organic EL element has a layer formed using the organic electronic material described above as a hole transport layer, and also has a hole injection layer, a conventional material may be used for the hole injection layer. Further, in those cases where, for example, the organic EL element has an organic layer formed using the organic electronic material described above as a hole injection layer, and also has a hole transport layer, a conventional material may be used for the hole transport layer.

Examples of materials that can be used for the hole injection layer and the hole transport layer include aromatic amine-based compounds (for example, aromatic diamines such as N,N'-di(naphthalen-1-yl)-N,N-diphenyl-benzidine (α-NPD)), phthalocyanine-based compounds, and thiophene-based compounds (for example, thiophene-based conductive polymers (such as poly(3,4-ethylenedioxythiophene):poly(4-styrenesulfonate) (PEDOT:PSS) and the like).

[Electron Transport Layer, Electron Injection Layer]

Examples of materials that can be used for the electron transport layer and the electron injection layer include phenanthroline derivatives, bipyridine derivatives, nitrosubstituted fluorene derivatives, diphenylquinone derivatives, thiopyran dioxide derivatives, condensed-ring tetracarboxylic acid anhydrides of naphthalene and perylene and the like, carbodiimides, fluorenylidenemethane derivatives, anthraquinodimethane and anthrone derivatives, oxadiazole derivatives, thiadiazole derivatives, benzimidazole derivatives (for example, 2,2',2"-(1,3,5-benzenetriyl)tris(1-phenyl-1H-benzimidazole) (TPBi)), quinoxaline derivatives, and aluminum complexes (for example, aluminum bis(2-methyl-8-quinolinolate)-4-(phenylphenolate) (BAlq)). Further, the organic electronic material of the embodiment described above may also be used.

[Cathode]

Examples of the cathode material include metals or metal alloys, such as Li, Ca, Mg, Al, In, Cs, Ba, Mg/Ag, LiF and CsF.

[Anode]

Metals (for example, Au) or other materials having conductivity can be used as the anode.

Examples of the other materials include oxides (for example, ITO: indium oxide/tin oxide), and conductive polymers (for example, polythiophene-polystyrene sulfonate mixtures (PEDOT:PSS)).

[Substrate]

Glass and plastics and the like can be used as the substrate. The substrate is preferably transparent. Further, a flexible substrate having flexibility is preferred. Specifically, quartz glass and light-transmitting resin films and the like are particularly preferred.

Examples of the resin films include films composed of polyethylene terephthalate, polyethylene naphthalate, polyethersulfone, polyetherimide, polyetheretherketone, polyphenylene sulfide, polyarylate, polyimide, polycarbonate, cellulose triacetate or cellulose acetate propionate.

In those cases where a resin film is used, an inorganic substance such as silicon oxide or silicon nitride may be coated onto the resin film to inhibit the transmission of water vapor and oxygen and the like.

[Emission Color]

There are no particular limitations on the emission color from the organic EL element. White organic EL elements can be used for various illumination fixtures, including domestic lighting, in-vehicle lighting, watches and liquid crystal backlights, and are consequently preferred.

The method used for forming a white organic EL element may employ a method in which a plurality of light-emitting materials are used to emit a plurality of emission colors simultaneously, which are then mixed to obtain a white light emission. There are no particular limitations on the combination of the plurality of emission colors, and examples include combinations that include three maximum emission wavelengths for blue, green and red, and combinations that include two maximum emission wavelengths for blue and yellow, or for yellowish green and orange or the like. Control of the emission color can be achieved by appropriate adjustment of the types and amounts of the light-emitting materials.

<Display Element, Illumination Device, Display Device>

In one embodiment, a display element contains the organic EL element of the embodiment described above. For example, by using the organic EL element as the element corresponding with each color pixel of red, green and blue (RGB), a color display element can be obtained. Examples of the image formation method include a simple matrix in which organic EL elements arrayed in a panel are driven directly by an electrode arranged in a matrix, and an active matrix in which a thin-film transistor is positioned on, and drives, each element.

Further, in one embodiment, an illumination device contains the organic EL element of an embodiment of the present invention.

Moreover, in one embodiment, a display device contains the illumination device, and a liquid crystal element as a display unit. For example, the display device may be a device that uses the illumination device of the embodiment described above as a backlight, and uses a conventional liquid crystal element as the display unit, namely a liquid crystal display device.

EXAMPLES

The present invention is described below in further detail using a series of examples, but the present invention is not limited by the following examples.

1. Preparation of Charge Transport Polymers

<Preparation of Pd Catalysts>

Solutions of Pd catalysts were prepared in the manner described below. All of the solvents used during catalyst preparation were deaerated by nitrogen bubbling for at least 30 minutes.

(Pd Catalyst 1)

In a glove box under a nitrogen atmosphere at room temperature, tris(dibenzylideneacetone)dipalladium (0.685 g, 0.748 mmol) was weighed into a sample tube, toluene (150 mL) was added, and the resulting mixture was agitated at room temperature for 5 minutes. In a similar manner, tris(t-butyl)phosphine (1.211 g, 5.986 mmol) was weighed into a sample tube, toluene (37 mL) was added, and the resulting mixture was agitated at room temperature for 5 minutes. The two solutions were then mixed together, and after stirring at room temperature for 5 minutes, the mixed solution was used as a catalyst.

(Pd Catalyst 2)

In a glove box under a nitrogen atmosphere at room temperature, tris(dibenzylideneacetone)dipalladium (0.574 g, 0.626 mmol) was weighed into a sample tube, toluene (125 mL) was added, and the resulting mixture was agitated at room temperature for 5 minutes. In a similar manner, tris(t-butyl)phosphine (1.014 g, 5.014 mmol) was weighed into a sample tube, toluene (31 mL) was added, and the resulting mixture was agitated at room temperature for 5 minutes. The two solutions were then mixed together, and after stirring at 80° C. for 10 minutes, the mixed solution was used as a catalyst.

(Pd Catalyst 3)

In a glove box under a nitrogen atmosphere at room temperature, tris(dibenzylideneacetone)dipalladium (73.2 mg, 80 µmol) was weighed into a sample tube, anisole (15 mL) was added, and the resulting mixture was agitated for 30 minutes. In a similar manner, tris(t-butyl)phosphine (129.6 mg, 640 µmol) was weighed into a sample tube, anisole (5 mL) was added, and the resulting mixture was agitated for 5 minutes. The two solutions were then mixed together, and after stirring at room temperature for 30 minutes, the mixed solution was used as a catalyst.

<Preparation of Charge Transport Polymers>

Various charge transport polymers were prepared in the manner described below.

(Charge Transport Polymer 1)

A three-neck round-bottom flask was charged with a monomer A shown below (5.0 mmol), a monomer B shown below (2.0 mmol), a monomer C1 shown below (4.0 mmol) and anisole (20 mL), and the prepared Pd catalyst 3 solution (7.5 mL) was then added. After stirring for 30 minutes, a 10% aqueous solution of tetraethylammonium hydroxide (20 mL) was added. All of the raw materials were deaerated by nitrogen bubbling for at least 30 minutes prior to use. The thus obtained mixture was heated and refluxed for 2 hours. All the operations up to this point were conducted under a stream of nitrogen.

[Chemical formula 9]

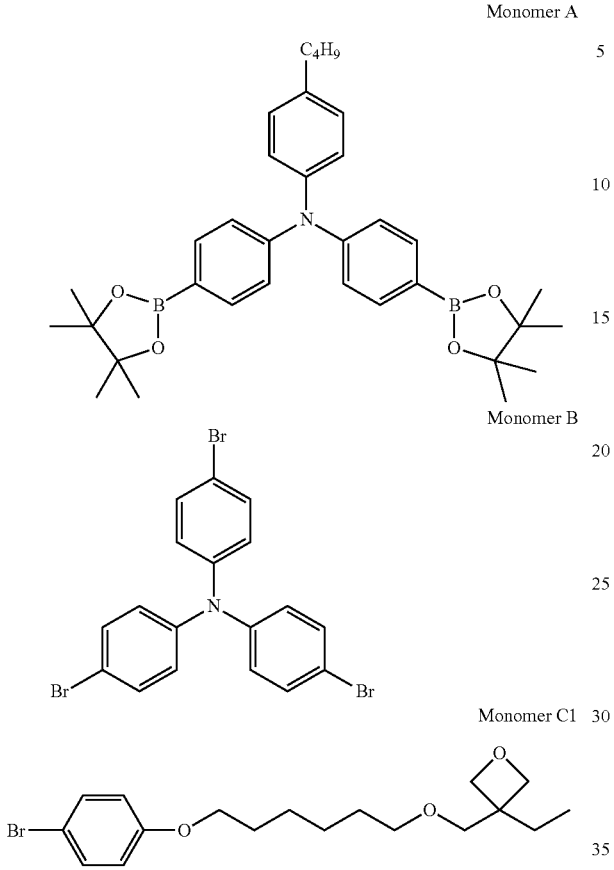

Monomer A

Monomer B

Monomer C1

After completion of the reaction, the organic layer was washed with water, and the organic layer was then poured into methanol-water (9:1) to re-precipitate the product. The resulting precipitate was collected by filtration under reduced pressure, and washed with methanol-water (9:1). The thus obtained precipitate was dissolved in toluene, and re-precipitated from methanol. The resulting precipitate was collected by filtration under reduced pressure and then dissolved in toluene, and a metal adsorbent (20% by weight relative to the weight of the precipitate) was then added to the solution and stirred overnight. Following completion of the stirring, the metal adsorbent and other insoluble matter were removed by filtration, and the filtrate was concentrated using a rotary evaporator. The concentrate was dissolved in toluene, and then re-precipitated from methanol-acetone (8:3). The thus produced precipitate was collected by filtration under reduced pressure and washed with methanol-acetone (8:3). The obtained precipitate was then dried under vacuum to obtain a charge transport polymer 1. The thus obtained charge transport polymer 1 had a number average molecular of 16,200 and a weight average molecular weight of 48,300.

(Charge Transport Polymer 2)

A three-neck round-bottom flask was charged with the monomer A shown above (5.0 mmol), the monomer B shown above (2.0 mmol), a monomer C2 shown below (4.0 mmol) and anisole (20 mL), and the prepared Pd catalyst 3 solution (7.5 mL) was then added. Thereafter, the same method as that described for preparation of the charge transport polymer 1 was used to obtain a charge transport polymer 2. The thus obtained charge transport polymer 2 had a number average molecular of 17,900 and a weight average molecular weight of 49,900.

[Chemical formula 10]

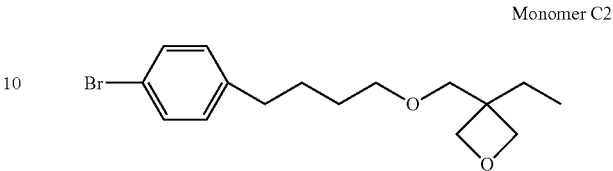

Monomer C2

(Charge Transport Polymer 3)

A three-neck round-bottom flask was charged with the monomer A (5.0 mmol), the monomer B shown above (2.0 mmol), a monomer C3 shown below (4.0 mmol) and anisole (20 mL), and the prepared Pd catalyst 3 solution (7.5 mL) was then added. Thereafter, the same method as that described for preparation of the charge transport polymer 1 was used to obtain a charge transport polymer 3. The thus obtained charge transport polymer 3 had a number average molecular of 14,700 and a weight average molecular weight of 42,000.

[Chemical formula 11]

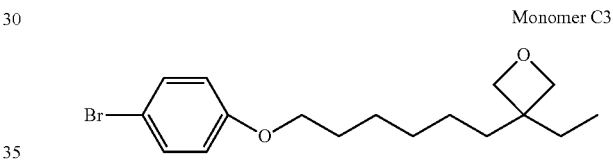

Monomer C3

(Charge Transport Polymer 4)

A four-neck round-bottom flask was charged with the monomer A shown above (0.261 mol), the monomer B shown above (0.104 mol), a monomer C4 shown below (0.209 mol), Aliquat 336 (4.34 mmol) and toluene (2,080 mL), and the mixture was subjected to nitrogen bubbling for 2 hours.

A 6 M aqueous solution of potassium hydroxide (350 ml) was then added to the solution, the prepared Pd catalyst 2 solution (43 mL) was added, and the resulting mixture was heated and refluxed for 2 hours. All the operations up to this point were conducted under a stream of nitrogen. Thereafter, the same method as that described for preparation of the charge transport polymer 1 was used to obtain a charge transport polymer 4. The thus obtained charge transport polymer 4 had a number average molecular of 15,800 and a weight average molecular weight of 58,300.

[Chemical formula 12]

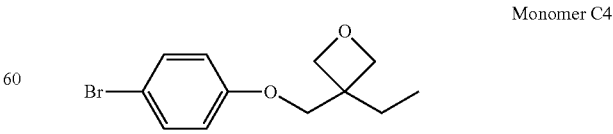

Monomer C4

(Charge Transport Polymer 5)

A three-neck round-bottom flask was charged with the monomer A shown above (5.0 mmol), the monomer B shown above (2.0 mmol), a monomer C5 shown below (4.0 mmol) and anisole (20 mL), and the prepared Pd catalyst 3 solution (7.5 mL) was then added. Thereafter, the same method as that described for preparation of the charge transport polymer 1 was used to obtain a charge transport polymer 5. The thus obtained charge transport polymer 5 had a number average molecular of 16,200 and a weight average molecular weight of 48,300.

[Chemical formula 13]

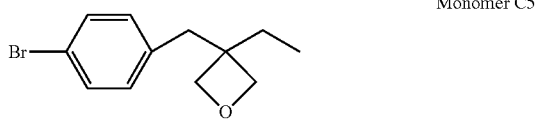

Monomer C5

(Charge Transport Polymer 6)

A four-neck round-bottom flask was charged with the monomer A shown above (0.435 mol), the monomer B shown above (0.174 mol), a monomer C6 shown below (0.348 mol), Aliquat 336 (0.362 mol), toluene (1,880 mL), potassium hydroxide (7.83 mol) and distilled water (1,300 mL), and the mixture was subjected to nitrogen bubbling for 2 hours. The prepared Pd catalyst 1 solution (87 mL) was then added to the mixture, and the resulting mixture was heated and refluxed for 2 hours. All the operations up to this point were conducted under a stream of nitrogen. Thereafter, the same method as that described for preparation of the charge transport polymer 1 was used to obtain a charge transport polymer 6. The thus obtained charge transport polymer 6 had a number average molecular of 17,000 and a weight average molecular weight of 69,900.

[Chemical formula 14]

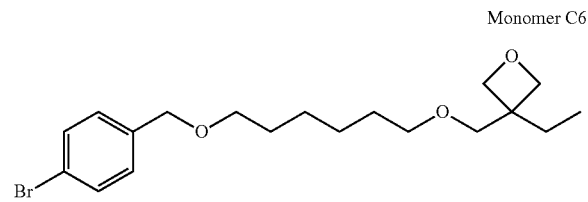

Monomer C6

2. Evaluation of Charge Transport Polymers

Example 1

The prepared charge transport polymer 1 was evaluated for solubility and heat resistance (thermal weight reduction) in the manner described below.

<Solubility>

The charge transport polymer 1 (8.8 mg) was weighed into a 6 mL screw top vial, and toluene (1 mL) was added. A stirring bar (10×ø4 mm) was placed in the vial and stirred at room temperature at 600 rpm.

The dissolution time required from the start of stirring until the polymer 1 had completely dissolved was measured. The dissolution time means the time required, based on visual observation of the solution, for the solution to become transparent. The dissolution time was classified into one of the three ranges shown in Table 1 to evaluate the solubility. An evaluation of 7 minutes or less was considered a practically applicable level (suitable for use in wet processes).

TABLE 1

| Classification | Dissolution time X/minutes | Evaluation |
|---|---|---|
| 1 | X ≤ 5 | A |
| 2 | 5 < X ≤ 7 | B |
| 3 | 7 < X | C |

<Heat Resistance>

Using a thermogravimetric-differential thermal analysis (TG-DTA) apparatus (DTG-60/60H, manufactured by Shimadzu Corporation), the thermal weight reduction (% by mass) when the charge transport polymer 1 (10 mg) was heated in the air to 300° C. under temperature increase conditions of 5° C./minute was measured. Based on the measured value Y for the thermal weight reduction (% by mass), the value was classified into one of the three ranges shown in Table 2 to evaluate the heat resistance. A thermal weight reduction of 6% by mass or less was considered a practically applicable level.

TABLE 2

| Classification | Thermal weight reduction Y (% by mass) | Evaluation |
|---|---|---|
| 1 | Y ≤ 3.0 | A |
| 2 | 3.0 < Y ≤ 6.0 | B |
| 3 | 6.0 < Y | C |

Examples 2 and 3

With the exception of replacing the charge transport polymer 1 of Example 1 with the charge transport polymers 2 and 3 respectively, the solubility and heat resistance were evaluated in exactly the same manner as Example 1. The results are shown in Table 3.

Comparative Examples 1 to 3

With the exception of replacing the charge transport polymer 1 of Example 1 with the charge transport polymers 4 to 6 respectively, the solubility and heat resistance were evaluated in exactly the same manner as Example 1. The results are shown in Table 3.

TABLE 3

| Item | Polymer | Solubility (dissolution time (minutes)) | Heat resistance (thermal weight reduction) (% by mass) |
|---|---|---|---|
| Example 1 | 1 | B (6.2) | B (4.9) |
| Example 2 | 2 | A (3.2) | B (6.0) |
| Example 3 | 3 | B (6.4) | B (3.1) |
| Comparative Example 1 | 4 | C (7.7) | B (3.1) |
| Comparative Example 2 | 5 | C (8.5) | A (1.5) |
| Comparative Example 3 | 6 | A (3.1) | C (6.8) |

As shown in Table 3, in the case of the charge transport polymers having at least one of the specific structural regions represented by formulas (1), (2) and (3) (Examples 1 to 3), excellent results were obtained for both the solubility and the heat resistance. In contrast, with the charge transport polymers that did not have one of the above specific structural regions (Comparative Examples 1 to 3), one of either the solubility or the heat resistance was a poor result. Specifically, in Comparative Examples 1 and 2, although favorable heat resistance was obtained, the solubility result was poor. Further, in Comparative Example 3, although favorable solubility was obtained, the heat resistance result was poor.

3. Organic Electronic Materials

<Production of Organic Hole-Only Devices (HOD)>

Using the charge transport polymers 1 to 3 and 6, for which the solubility had been evaluated as practically applicable for wet processes, organic HODs were produced in accordance with the following Examples 4 to 6 and Comparative Example 4.

Example 4

An ink composition was prepared in the open atmosphere by mixing the charge transport polymer 1 prepared above (10.0 mg), a polymerization initiator 1 shown below (0.5 mg) and toluene (2.3 mL). This ink composition was spin-coated at a rotational rate of 3,000 min$^{-1}$ onto a glass substrate on which ITO had been patterned with a width of 1.6 mm, and the ink composition was then cured by heating on a hot plate at 200° C. for 30 minutes, thus forming a hole injection layer (100 nm).

[Chemical formula 15]

Polymerization initiator 1

The glass substrate obtained above was transferred into a vacuum deposition apparatus, α-NPD (20 nm) and Al (100 nm) were deposited sequentially on top of the hole injection layer using deposition methods, and a sealing treatment was then performed to complete production of an organic HOD-1.

Using the same procedure as that used in the production of the organic HOD-1, the ink composition was spin-coated at a rotational rate of 3,000 min$^{-1}$ onto a glass substrate on which ITO had been patterned with a width of 1.6 mm, and the ink composition was heated on a hot plate at 200° C. for 30 minutes. Additional heating was then conducted at 230° C. for 30 minutes under a nitrogen atmosphere to form a hole injection layer. Following formation of the hole injection layer in this manner, an organic HOD-2 was then produced in exactly the same manner as the organic HOD-1.

Examples 5 and 6

With the exception of replacing the charge transport polymer 1 with the charge transport polymer 2 or 3 respectively in the formation steps for the hole injection layers in the organic HODs of Example 4, an organic HOD-1 and an organic HOD-2 were produced in the same manner as Example 4.

Comparative Example 4

With the exception of replacing the charge transport polymer 1 with the charge transport polymer 6 in the formation steps for the hole injection layers in the organic HODs of Example 4, an organic HOD-1 and an organic HOD-2 were produced in the same manner as Example 4.

<Evaluation of Organic HODs>

A voltage was applied to the organic HOD-1 and the organic HOD-2 produced in each of Examples 4 to 6 and Comparative Example 4. The results indicated current flow in each case, confirming that each of the elements had hole injection functionality.

Further, the drive voltage at a current density of 300 mA/cm was measured for each element. The conductivity was then evaluated against the following evaluation criteria. The results are shown in Table 4.

(Conductivity Evaluation Criteria)

Good: an increase in drive voltage of less than 5 V

Poor: an increase in drive voltage of 5 V or greater

TABLE 4

| Item | Polymer | Drive voltage 1 (V) | Drive voltage 2 (V) | Increase in drive voltage | Conductivity |
|---|---|---|---|---|---|
| Example 4 | 1 | 3.0 | 4.3 | 1.3 | good |
| Example 5 | 2 | 2.6 | 4.6 | 2.0 | good |
| Example 6 | 3 | 2.7 | 3.1 | 0.4 | good |
| Comparative Example 4 | 6 | 3.5 | >10.0 | >6.5 | poor |

(Notes)

Drive voltage 1: the voltage ($V_1$) measured at a current density of 300 mA/cm for the organic HOD-1 having an organic layer obtained by heating at 200° C. for 30 minutes.

Drive voltage 2: the voltage ($V_2$) measured at a current density of 300 mA/cm for the organic HOD-2 having an organic layer obtained by heating at 200° C. for 30 minutes and then at 230° C. for 30 minutes.

Increase in drive voltage: the value of drive voltage 2 ($V_2$)-drive voltage 1 ($V_1$).

Measurements of the drive voltage were performed using a SourceMeter 2400 apparatus manufactured by Keithley Instruments, LLC, under conditions including a measurement temperature of 25° C.

As is evident from Table 4, Examples 4 to 6 exhibited a clearly smaller increase in the drive voltage and superior conductivity results compared with Comparative Example 4. As is evident from Table 3 shown above, the charge transport polymers 1 to 3 used in Examples 4 to 6 had a smaller thermal weight reduction upon heating at 300° C. and superior heat resistance compared with the charge transport polymer 6 used in Comparative Example 4. In other words, it was evident that by using a charge transport polymer having superior heat resistance, thermal degradation of the organic layer was suppressed, meaning any deterioration in the performance of the organic layer could also be suppressed.

DESCRIPTION OF THE REFERENCE SIGNS

1: Light-emitting layer
2: Anode
3: Hole injection layer
4: Cathode
5: Electron injection layer
6: Hole transport layer
7: Electron transport layer
8: Substrate

The invention claimed is:

1. An organic electronic material comprising a charge transport compound having a divalent structural unit, a trivalent or higher structural unit, and a monovalent structural unit represented by formula (3) shown below:

$$—Ar—O—(CH_2)_c—X \quad (3)$$

wherein Ar represents an arylene group or heteroarylene group of 2 to 30 carbon atoms, c represents an integer of 5 to 6, and X represents a substituted or unsubstituted polymerizable functional group,
wherein the polymerizable functional group comprises at least one group selected from an oxetane group, epoxy group, vinyl group, acryloyl group and methacryloyl group substituted with a saturated alkyl group with 1 to 4 carbon atoms or an unsubstituted oxetane group, epoxy group, vinyl group, acryloyl group and methacryloyl group,
wherein a proportion of the trivalent or higher structural unit based on a total of all the structural units is at least 1 mol % and not more than 50 mol %, and
wherein a thermal weight reduction upon heating at 300° C. of the charge transport compound is not more than 3.5% by mass relative to a mass of the charge transport compound prior to heating.

2. The organic electronic material according to claim 1, wherein the structural unit represented by the formula (3) comprises a structure represented by formula 3-1 shown below:

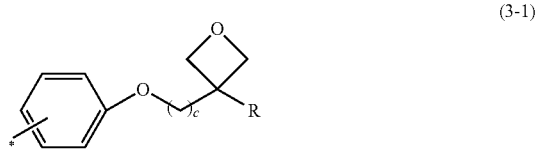

(3-1)

wherein c represents an integer of 5 to 6, and R represents a methyl group or an ethyl group.

3. The organic electronic material according to claim 1, wherein the charge transport compound has hole injection properties.

4. The organic electronic material according to claim 1, wherein the charge transport compound contains at least one structure selected from the group consisting of aromatic amine structures, carbazole structures, thiophene structures, benzene structures, phenoxazine structures and fluorene structures.

5. The organic electronic material according to claim 1, wherein a molar ratio between the divalent structural unit, the monovalent structural unit, and the trivalent or higher structural unit is 100:(10 to 200):(10 to 100).

6. An ink composition comprising the organic electronic material according to claim 1, and a solvent.

7. An organic layer formed using the organic electronic material according to claim 1.

8. An organic electronic element comprising the organic layer according to claim 7.

9. An organic electroluminescent element comprising the organic layer according to claim 7.

10. A display element comprising the organic electroluminescent element according to claim 9.

11. An illumination device comprising the organic electroluminescent element according to claim 9.

12. A display device comprising the illumination device according to claim 11, and a liquid crystal element as a display unit.

13. An organic layer formed using the ink composition according to claim claim 6.

14. An organic electronic element comprising the organic layer according to claim 13.

15. An organic electroluminescent element comprising the organic layer according to claim 13.

16. A display element comprising the organic electroluminescent element according to claim 15.

17. An illumination device comprising the organic electroluminescent element according to claim 15.

18. A display device comprising the illumination device according to claim 17, and a liquid crystal element as a display unit.

19. The organic electronic material according to claim 1, wherein a proportion of the monovalent structural unit represented by formula (3) based on a total of all monovalent structural units is at least 50 mol %.

* * * * *